(12) United States Patent
Furuya

(10) Patent No.: US 11,349,461 B2
(45) Date of Patent: May 31, 2022

(54) FLIP-FLOP CIRCUIT AND OSCILLATOR

(71) Applicant: Seiko Epson Corporation, Toyko (JP)

(72) Inventor: Yasunari Furuya, Fujimi (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/123,891

(22) Filed: Dec. 16, 2020

(65) Prior Publication Data

US 2021/0184662 A1 Jun. 17, 2021

(30) Foreign Application Priority Data

Dec. 17, 2019 (JP) .............................. JP2019-227156

(51) Int. Cl.
*H03K 3/356* (2006.01)
*H03K 19/0185* (2006.01)
*H03K 3/037* (2006.01)

(52) U.S. Cl.
CPC ....... *H03K 3/356104* (2013.01); *H03K 3/037* (2013.01); *H03K 19/0185* (2013.01)

(58) Field of Classification Search
CPC ..... H03K 3/356104; H03K 19/018521; H03K 19/0185; H03K 19/018571; H03K 19/018507; H03K 19/0948; H03K 3/037
See application file for complete search history.

(56) References Cited

U.S. PATENT DOCUMENTS 6,635,934 B2 * 10/2003 Hidaka .............. H03K 19/0016
257/369
2005/0242861 A1 11/2005 Kanda et al.

FOREIGN PATENT DOCUMENTS

JP 2005-318479 A 11/2005

* cited by examiner

*Primary Examiner* — Jung Kim
(74) *Attorney, Agent, or Firm* — Harness, Dickey & Pierce, P.L.C.

(57) ABSTRACT

A flip-flop circuit includes gate circuits of which the number is N being an integer of 3 or more, and in which an output signal from the (N−1)th gate circuit is used as an input signal of the N-th gate circuit, the gate circuit being configured to output the output signal in response to a clock signal and the input signal. The N gate circuits include a first MOS transistor group including MOS transistors which are in an OFF state when a potential of an output signal node that outputs the output signal is held, and a second MOS transistor group including MOS transistors which are in an ON state when the potential of the output signal node is held. A threshold voltage of at least one MOS transistor in the first MOS transistor group is higher than a threshold voltage of at least one MOS transistor in the second MOS transistor group.

13 Claims, 19 Drawing Sheets

FLIP-FLOP CIRCUIT AND OSCILLATOR

The present application is based on, and claims priority from JP Application Serial Number 2019-227156, filed Dec. 17, 2019, the disclosure of which is hereby incorporated by reference herein in its entirety.

BACKGROUND

1. Technical Field

The present disclosure relates to a flip-flop circuit and an oscillator.

2. Related Art

In the related art, a flip-flop circuit in which a gate circuit in which a plurality of MOS transistors are coupled in series is formed, ON and OFF of each MOS transistor is controlled by an input signal and a clock signal, and the potential of a node between the MOS transistors is transmitted, as an output signal, to a gate circuit at the subsequent stage is known. In such a flip-flop circuit (true single phase clocking (TSPC) type flip-flop circuit), a period in which the potential of a node is required to be held in a floating state in which both MOS transistors coupled so as to interpose the node are in an OFF state may be provided. The floating state does not have a problem when the flip-flop circuit operates at a high speed. However, when the flip-flop circuit operates at a low speed, the potential may not be correctly held by a leakage current of the MOS transistor being in the OFF state. JP-A-2005-318479 discloses a configuration in which a level fixing unit including a delay circuit and the like is provided in order to fix the level of a node in the floating state.

In the above-described related art, since it is required to provide the level fixing unit, the circuit size may increase, and the current consumption may increase.

SUMMARY

To solve the above problem, a flip-flop circuit includes gate circuits of which the number is N being an integer of 3 or more, and in which an output signal from the (N−1)th gate circuit is used as an input signal of the N-th gate circuit, the gate circuit being configured to output the output signal in response to a clock signal and the input signal. The N gate circuits include a first MOS transistor group including MOS transistors which are in an OFF state when holding a potential of an output signal node that outputs the output signal, and a second MOS transistor group including MOS transistors which are in an ON state when holding the potential of the output signal node. A threshold voltage of at least one MOS transistor in the first MOS transistor group is higher than a threshold voltage of at least one MOS transistor in the second MOS transistor group.

DESCRIPTION OF EXEMPLARY EMBODIMENTS

Embodiments of the present disclosure will be described in the following order.
(1) Configuration of Oscillator:
(1-1) Configuration of Flip-flop Circuit:
(1-2) Operation of Flip-flop Circuit:
(1-2-1) Threshold Voltages of Third and Ninth MOS Transistors:
(1-2-2) Threshold Voltages of Fifth and Seventh MOS Transistors:
(1-2-3) Threshold Voltages of Second and Fourth MOS Transistors:
(2) Other Embodiments:

(1) Configuration of Oscillator

Figure 1:
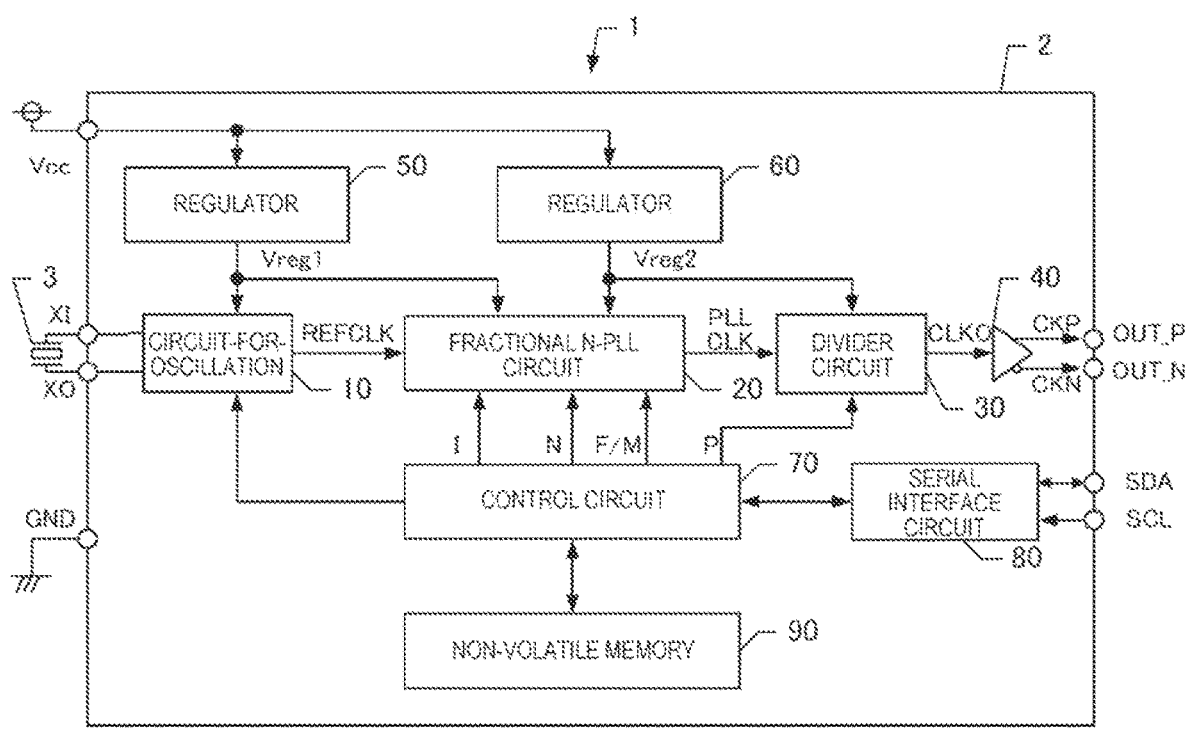
FIG. 1 is a configuration diagram illustrating an oscillator according to an embodiment of the present disclosure.

FIG. 1 is a configuration diagram illustrating an oscillator according to an embodiment of the present disclosure. An oscillator 1 includes an oscillation circuit 2 and a resonator 3, and the oscillation circuit 2 and the resonator 3 are accommodated in a package (not illustrated). In the present embodiment, the resonator 3 is a crystal resonator using quartz crystal as a substrate material. For example, an AT cut or SC cut crystal resonator is used. The resonator 3 may be a surface acoustic wave (SAW) resonator or a micro-electro mechanical systems (MEMS) resonator. Piezoelectric single crystal such as lithium tantalate or lithium niobate, a piezoelectric material such as piezoelectric ceramics, for example, lead zirconate titanate, or a silicon semiconductor material may be used in addition to quartz crystal, as the substrate material of the resonator 3. As an excitation unit for the resonator 3, a unit using a piezoelectric effect may be used, or electrostatic drive by the Coulomb force may be used.

A Vcc terminal as a power supply terminal, a GND terminal as a ground terminal, an OUT_P terminal and an OUT_N terminal as differential output terminals, an SDA terminal and an SCL terminal for an external interface, and an XI terminal and an XO terminal as coupling terminals to the resonator 3 are provided in the oscillation circuit 2. The Vcc terminal, the GND terminal, the OUT_P terminal, the OUT_N terminal, the SDA terminal, and the SCL terminal are also coupled to an external terminal (not illustrated) of the oscillator 1.

In the present embodiment, the oscillation circuit 2 includes a circuit-for-oscillation 10, a fractional N-PLL circuit 20, a divider circuit 30, an output circuit 40, a regulator 50, a regulator 60, a control circuit 70, a serial interface (I/F) circuit 80, and a non-volatile memory 90. In the present embodiment, the oscillation circuit 2 may have a configuration in which some of the above elements are omitted or changed, or other elements are added. The oscillation circuit 2 may be a semiconductor integrated circuit (IC) integrated into one chip, or may be configured by an IC of a plurality of chips. In addition, a portion of the oscillation circuit 2 may be configured by discrete components.

The circuit-for-oscillation 10 is a circuit for oscillating the resonator 3. The circuit-for-oscillation amplifies the output signal of the resonator 3 and feeds the amplified signal back to the resonator 3. The circuit-for-oscillation 10 outputs a clock signal (oscillation signal) REFCLK based on the oscillation of the resonator 3. For example, the oscillation circuit configured by the resonator 3 and the circuit-for-oscillation 10 may be various types of oscillation circuits such as a Pierce oscillation circuit, an inverter type oscillation circuit, a Colpitts oscillation circuit, and a Hartley oscillation circuit.

The fractional N-PLL circuit 20 generates a clock signal PLLCLK obtained by multiplying the frequency (reference frequency) of the clock signal REFCLK by an integer or (integer+ fraction), in accordance with a division ratio input from the control circuit 70. Here, when the integer portion (integer division ratio) of the division ratio is set as N and the fractional portion (fractional division ratio) of the division ratio is F/M, a relation of Expression (1) is established between the frequency fREFCLK of the clock signal REFCLK and the frequency fPLLCLK of the clock signal PLLCLK.

$$f_{PLLCLK} = \left(N + \frac{F}{M}\right) \times f_{REFCLK} \quad (1)$$

The divider circuit 30 divides the clock signal PLLCLK output by the fractional N-PLL circuit 20, by an output division ratio P (P is an integer of 1 or more) input from the control circuit 70 to generate a clock signal CLKO. Here, a relationship of Expression (2) is established between the frequency fPLLCLK of the clock signal PLLCLK and the frequency fCLKO of the clock signal CLKO.

$$f_{CLKO} = \frac{f_{PLLCLK}}{P} \quad (2)$$

Thus, from Expressions (1) and (2), a relationship of Expression (3) is established between the frequency fREFCLK of the clock signal REFCLK and the frequency fCLKO of the clock signal CLKO.

$$f_{CLKO} = \left(N + \frac{F}{M}\right) \times \frac{f_{REFCLK}}{P} \quad (3)$$

The output circuit 40 converts the clock signal CLKO output from the divider circuit 30 into a differential signal formed by a non-inverted signal CKP and an inverted signal CKN. The non-inverted signal CKP is output to the outside from the output terminal OUT_P, and the inverted signal CKN is output to the outside from the output terminal OUT_N. The output circuit 40 may be, for example, a differential output circuit such as a low voltage differential signaling (LVDS) circuit, a positive emitter coupled logic (PECL) circuit, and a low voltage PECL (LVPECL) circuit. The output circuit 40 may be a single-ended output circuit.

The regulator 50 generates a constant voltage Vreg1 lower than a power supply voltage Vcc, based on the voltage Vcc supplied from the Vcc terminal. The constant voltage Vreg1 is supplied as the power supply voltage of the circuit-for-oscillation 10 and the power supply voltage of a portion of the fractional N-PLL circuit 20.

The regulator 60 generates a constant voltage Vreg2 lower than the power supply voltage Vcc, based on the voltage Vcc supplied from the Vcc terminal. The constant voltage Vreg2 is supplied as a power supply voltage for the divider circuit 30 and a portion of the fractional N-PLL circuit 20.

In the present embodiment, the constant voltage Vreg1 is equal to the constant voltage Vreg2. The voltage Vreg1 may be different from the voltage Vreg2 so long as an erroneous operation does not occur in an interface portion between a circuit using the voltage Vreg1 as the power supply voltage and a circuit using the voltage Vreg2 as the power supply voltage.

In the present embodiment, the serial interface circuit 80 is a digital interface circuit of the I²C standard. A serial data signal is input and output from the SDA terminal, and the clock signal is input through the SCL terminal. Read and write from and in a control register (not illustrated) of the control circuit 70 or the non-volatile memory 90 from an external device may be performed through the SDA terminal, the SCL terminal, and the serial interface circuit 80. The serial interface circuit 80 may be an interface circuit of a communication standard other than I²C. The oscillator 1 may not include an external terminal (SDA terminal and SCL terminal in FIG. 1) dedicated for the interface. For example, the OUT_P terminal, the OUT_N terminal, or a functional terminal (not illustrated) may be also used as the external terminal for the interface by switching a mode from the outside.

The control circuit 70 includes the control register (not illustrated), and controls operations of the circuit-for-oscillation 10, the fractional N-PLL circuit 20, and the divider circuit 30 in accordance with the setting value of the control register. In the control register, the magnitude of a current in a current source of a charge pump circuit may be set, the frequency adjustment value and the like of the circuit-for-oscillation 10 may be set, the integer division ratio N and the fractional division ratio F/M of the fractional N-PLL circuit 20 may be set, and the output division ratio P of the divider circuit 30 may be set, for example. In the present embodiment, the external device sets the magnitude I of the current, the integer division ratio N, the fractional division ratio F/M, and the output division ratio P through the serial interface circuit 80, and supplies the set values to the fractional N-PLL circuit 20. The divider circuit 30 divides the clock signal PLLCLK in accordance with the output division ratio P, and thus a clock signal having a frequency determined by Expression (3) is output from the OUT_P terminal and the OUT_N terminal.

The non-volatile memory 90 is realized by an electrically erasable programmable read-only memory (EEPROM) or the like, and stores data necessary and the like when the oscillator 1 is started (when the power is supplied). For example, the non-volatile memory 90 stores control data for frequency adjustment and the like of the oscillation control circuit, and initial values of the magnitude I of the current in the current source of the charge pump circuit, the integer division ratio N, the fractional division ratio F/M, and the output division ratio P. The control circuit 70 reads out the data stored in the non-volatile memory 90 and sets the read data in the control register to perform various controls, when the oscillator 1 is started (when the power is supplied).

(1-1) Configuration of Flip-Flop Circuit:

A flip-flop circuit according to an embodiment of the present disclosure is used in at least a portion of the oscillator 1 according to the present embodiment. For example, the flip-flop circuit may be used in a delta-sigma modulation circuit and a divider circuit in the fractional N-PLL circuit 20. The flip-flop circuit according to the embodiment of the present disclosure may be used in various other circuits.

Figure 2:
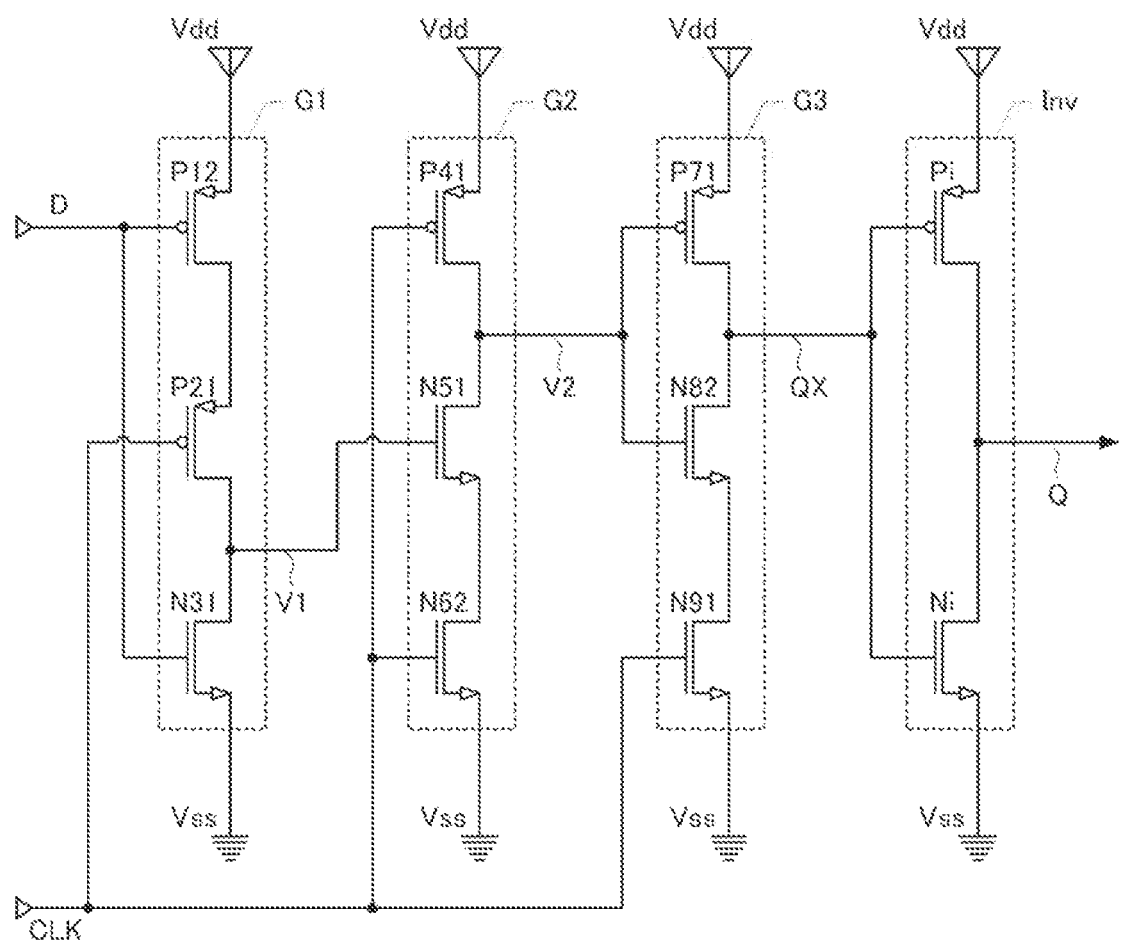
FIG. 2 is a diagram illustrating a flip-flop circuit.

FIG. 2 is a diagram illustrating the flip-flop circuit according to the embodiment of the present disclosure. The flip-flop circuit includes N (N is an integer of 3 or more) gate circuits that output signals in response to a clock signal and input signals. The output signal from the (N−1)th gate circuit serves as the input signal of the N-th gate circuit. In the present embodiment, N is 3, and thus the gate circuits are referred to as first to third gate circuits G1 to G3. The output signal from the third gate circuit G3 serves as an input signal of a CMOS inverter circuit Inv.

The first to third gate circuits G1 to G3 and the CMOS inverter circuit Inv are provided between a high potential node Vdd as a power supply node having a predetermined potential and a low potential node Vss as a ground node.

Each gate circuit includes a plurality of MOS transistors coupled in series between the high potential node Vdd and the low potential node Vss. In the present embodiment, each of the first to third gate circuits G1 to G3 includes three MOS transistors, and the CMOS inverter circuit Inv includes two MOS transistors.

The first gate circuit G1 includes a first MOS transistor P12, a second MOS transistor P21, and a third MOS transistor N31 which are coupled in series between the high potential node Vdd and the low potential node Vss and are arranged from the high potential side to the low potential side. The source of the first MOS transistor P12 is coupled to the high potential node Vdd, and the drain of the first MOS transistor is coupled to the source of the second MOS transistor P21. The drain of the third MOS transistor N31 is coupled to the drain of the second MOS transistor P21, and the source of the third MOS transistor N31 is coupled to the low potential node Vss.

The second gate circuit G2 includes a fourth MOS transistor P41, a fifth MOS transistor N51, and a sixth MOS transistor N62 which are coupled in series between the high potential node Vdd and the low potential node Vss and are arranged from the high potential side to the low potential side. The source of the fourth MOS transistor P41 is coupled to the high potential node Vdd, and the drain of the fourth MOS transistor is coupled to the drain of the fifth MOS transistor N51. The drain of the sixth MOS transistor N62 is coupled to the source of the fifth MOS transistor N51, and the source of the sixth MOS transistor N62 is coupled to the low potential node Vss.

The third gate circuit G3 includes a seventh MOS transistor P71, an eighth MOS transistor N82, and a ninth MOS transistor N91 which are coupled in series between the high potential node Vdd and the low potential node Vss and are arranged from the high potential side to the low potential side. The source of the seventh MOS transistor P71 is coupled to the high potential node Vdd, and the drain of the seventh MOS transistor is coupled to the drain of the eighth MOS transistor N82. The drain of the ninth MOS transistor N91 is coupled to the source of the eighth MOS transistor N82, and the source of the ninth MOS transistor N91 is coupled to the low potential node Vss.

The CMOS inverter circuit Inv includes a tenth MOS transistor Pi and an eleventh MOS transistor Ni which are coupled in series between the high potential node Vdd and the low potential node Vss, and are arranged from the high potential side to the low potential side. The source of the tenth MOS transistor Pi is coupled to the high potential node Vdd, and the drain of the tenth MOS transistor is coupled to the drain of the eleventh MOS transistor Ni. The source of the eleventh MOS transistor Ni is coupled to the low potential node Vss.

In the reference signs of the transistors, P indicates a P-type PMOS transistor, and N indicates an N-type NMOS transistor (the same is applied to the following description). Thus, in the flip-flop circuit illustrated in FIG. 2, the first, second, fourth, and seventh MOS transistors P12, P21, P41, P71 and the tenth MOS transistor Pi are PMOS transistors. The third, fifth, sixth, eighth, ninth MOS transistors N31, N51, N62, N82, N91 and the eleventh MOS transistor Ni are NMOS transistors. In the reference signs of the transistors, the numerical value of the upper digit of the numerical value added after P or N indicates a number for identifying an individual MOS transistor, and the numerical value of the lower digit indicates a number for identifying a transistor group (described later). Therefore, P12 indicates that the first MOS transistor belongs to a second MOS transistor group.

The flip-flop circuit includes an input signal node D to which an input signal for the flip-flop circuit is input and a clock signal node CLK to which a clock signal for the flip-flop circuit is input. The input signal node D is coupled to the gates of the first MOS transistor P12 and the third MOS transistor N31 forming the first gate circuit G1. The clock signal node CLK is coupled to the gate of the second MOS transistor P21 forming the first gate circuit G1. The clock signal node CLK is coupled to the gate of the fourth MOS transistor P41 and the gate of the sixth MOS transistor N62, which the fourth MOS transistor and the sixth MOS transistor form the second gate circuit G2. The clock signal node CLK is coupled to the gate of the ninth MOS transistor N91 forming the third gate circuit G3.

In the flip-flop circuit, the output signal from the (N−1)th gate circuit serves as the input signal to the N-th gate circuit. That is, a node between the drain of the second MOS transistor P21 and the drain of the third MOS transistor N31, in the first gate circuit G1, is an output signal node V1. The output signal node V1 also functions as an input signal node for inputting an input signal to the second gate circuit G2. The output signal node V1 is coupled to the gate of the fifth MOS transistor N51 forming the second gate circuit G2.

A node between the drain of the fourth MOS transistor P41 and the drain of the fifth MOS transistor N51, in the second gate circuit G2, is an output signal node V2. The output signal node V2 also functions as an input signal node for inputting an input signal to the third gate circuit G3. The output signal node V2 is coupled to the gates of the seventh MOS transistor P71 and the eighth MOS transistor N82 forming the third gate circuit G3.

A node between the drain of the seventh MOS transistor P71 and the drain of the eighth MOS transistor N82, in the third gate circuit G3, is an output signal node QX. The output signal node QX also functions as an input signal node for inputting an input signal to the CMOS inverter circuit Inv. The output signal node QX is coupled to the gates of the tenth MOS transistor Pi and the eleventh MOS transistor Ni. A node between the drain of the tenth MOS transistor Pi and the drain of the eleventh MOS transistor Ni is an output signal node Q for outputting an output signal from the flip-flop circuit.

With the above configuration, the potential of the input signal node D to which an input signal for the flip-flop circuit is input is used as the output of the output signal node Q after conversion by each gate circuit and conversion by the CMOS inverter circuit Inv. That is, the flip-flop circuit outputs the potential corresponding to the potentials of the input signal node D and the clock signal node CLK, from the output signal node Q. The potential of the output signal node QX may also be used as the output signal.

Figure 3:
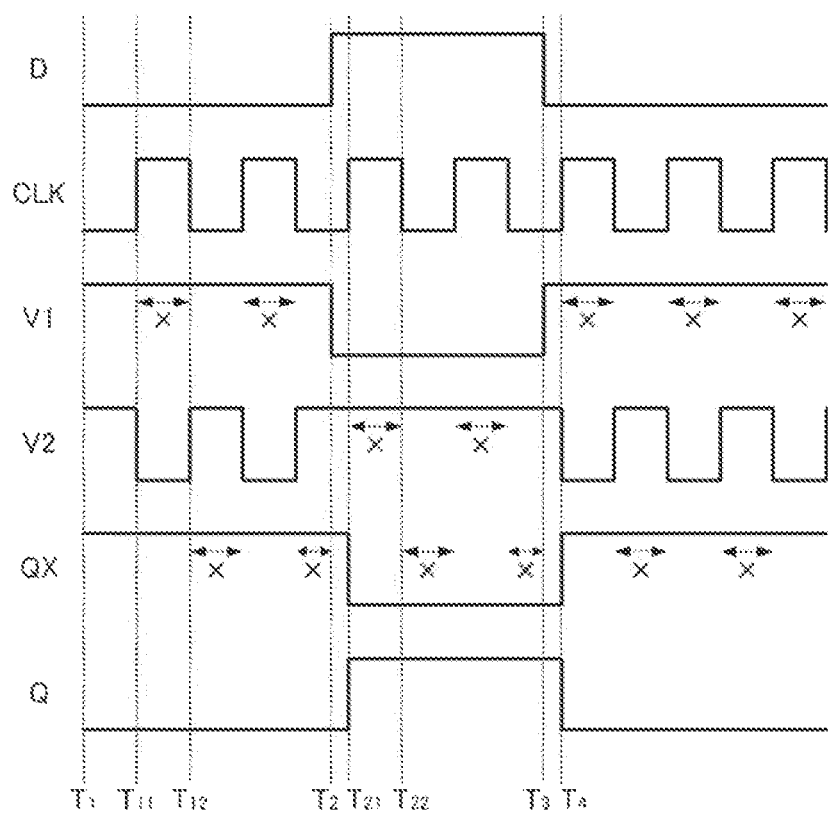
FIG. 3 is a timing chart illustrating the flip-flop circuit.

(1-2) Operation of Flip-Flop Circuit:

Next, an operation of the flip-flop circuit having the above configuration will be described. FIG. 3 is a timing chart illustrating the operation of the flip-flop circuit. Here, it is assumed that the input signal node D has a high level and a low level, and a clock signal which is a pulse of a constant cycle is applied to the clock signal node CLK. In the present embodiment, the high level is also referred to as 1, and the low level is also referred to as 0.

In the example illustrated in FIG. 3, each of the input signal node D and the clock signal node CLK has two states of a high potential and a low potential. The output signal nodes V1, V2, QX, Q also have two states of the high potential or the low potential. In the present embodiment, the high potential is also referred to as 1, and the low potential is also referred to as 0.

Figure 4:
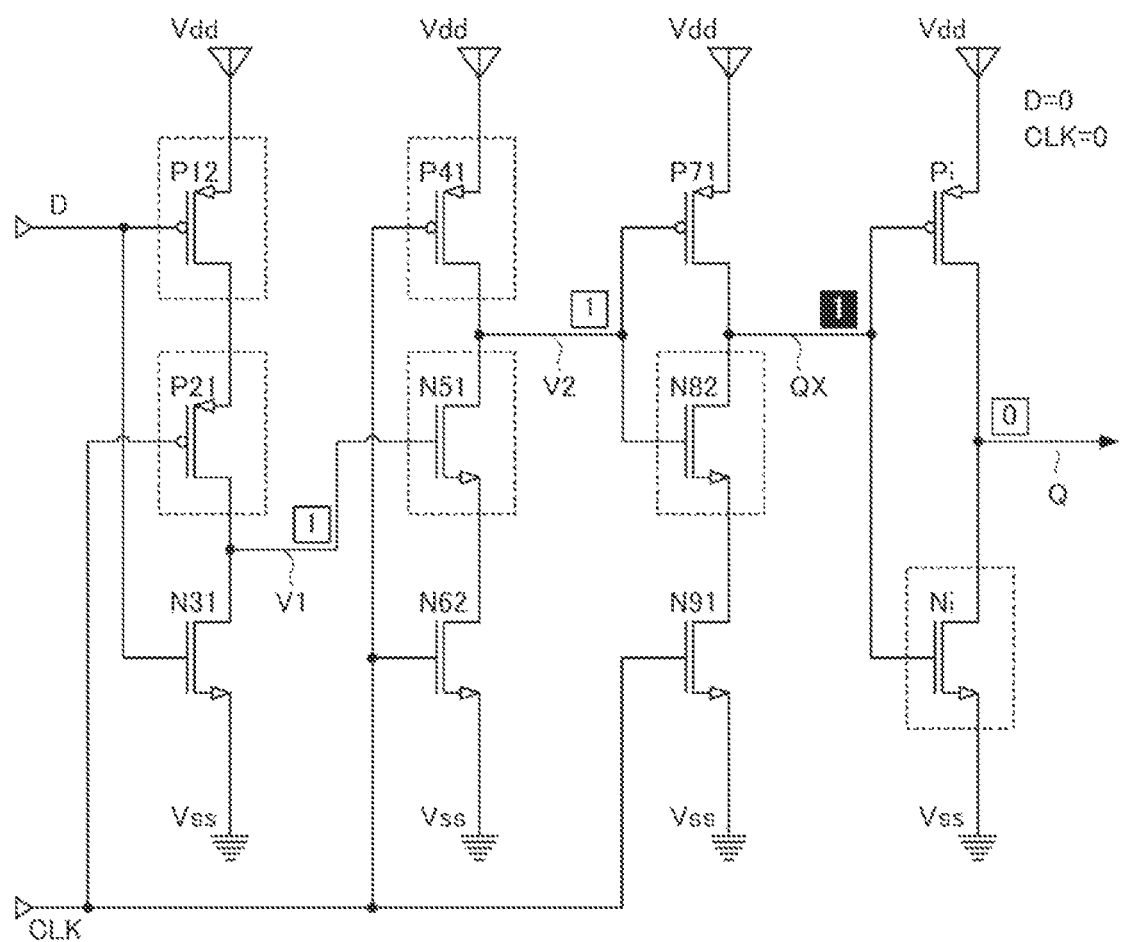
FIG. 4 is a diagram illustrating the flip-flop circuit.

FIG. 4 illustrates the state of each node and the state of each transistor in the flip-flop circuit at a time point $T_1$. The state of the node is indicated by 1 or 0, and the state of the transistor, that is, ON or OFF, is indicated by a dashed rectangle surrounding the MOS transistor in an ON state and a rectangle not surrounding the MOS transistor in an OFF state (the same is applied to the following description).

As illustrated in FIG. 3, the state of the input signal node D is 0 at the time point $T_1$. Then, it is assumed that the state of the input signal node D changes to 1 at a time point $T_2$ and then the state of the input signal node D changes to 0 at a time point $T_3$. A time point $T_4$ is a time point at which the state of the clock signal node CLK changes from 0 to 1 for the first time after the time point $T_3$. At the time point $T_1$, since the state of the input signal node D is 0 and the state of the clock signal node CLK is 0, the first MOS transistor P12 is in the ON state, the second MOS transistor P21 is in the ON state, and the third MOS transistor N31 is in an OFF state. As a result, the output signal node V1 comes to being electrically coupled to the high potential node Vdd, and thus the state of the output signal node V1 becomes 1.

In this case, since the state of the output signal node V1 is 1 and the state of the clock signal node CLK is 0, the fourth MOS transistor P41 is in the ON state, the fifth MOS transistor N51 is in the ON state, and the sixth MOS transistor N62 is in the OFF state. As a result, the output signal node V2 comes to being electrically coupled to the high potential node Vdd, and the state of the output signal node V2 becomes 1.

Further, since the state of the output signal node V2 is 1 and the state of the clock signal node CLK is 0, the seventh MOS transistor P71 is in the OFF state, the eighth MOS transistor N82 is in the ON state, and the ninth MOS transistor N91 is in the OFF state. As a result, the output signal node QX is brought into a state of not being electrically coupled to either the high potential node Vdd or the low potential node Vss. Thus, the state of the output signal node QX is determined by holding the state of the output signal node QX before the output signal node V2 changes to 1. In the example illustrated in FIG. 4, it is assumed that the state of the output signal node QX is 1. In this case, the state of the output signal node Q in the CMOS inverter circuit Inv becomes 0. The state of not being electrically coupled to either the high potential node Vdd or the low potential node Vss is referred to as a floating state in this specification. In FIG. 4, a white value on a black background indicates that the output signal node QX is in the floating state. A black value on a white background indicates a state of not being in the floating state.

Figure 5:
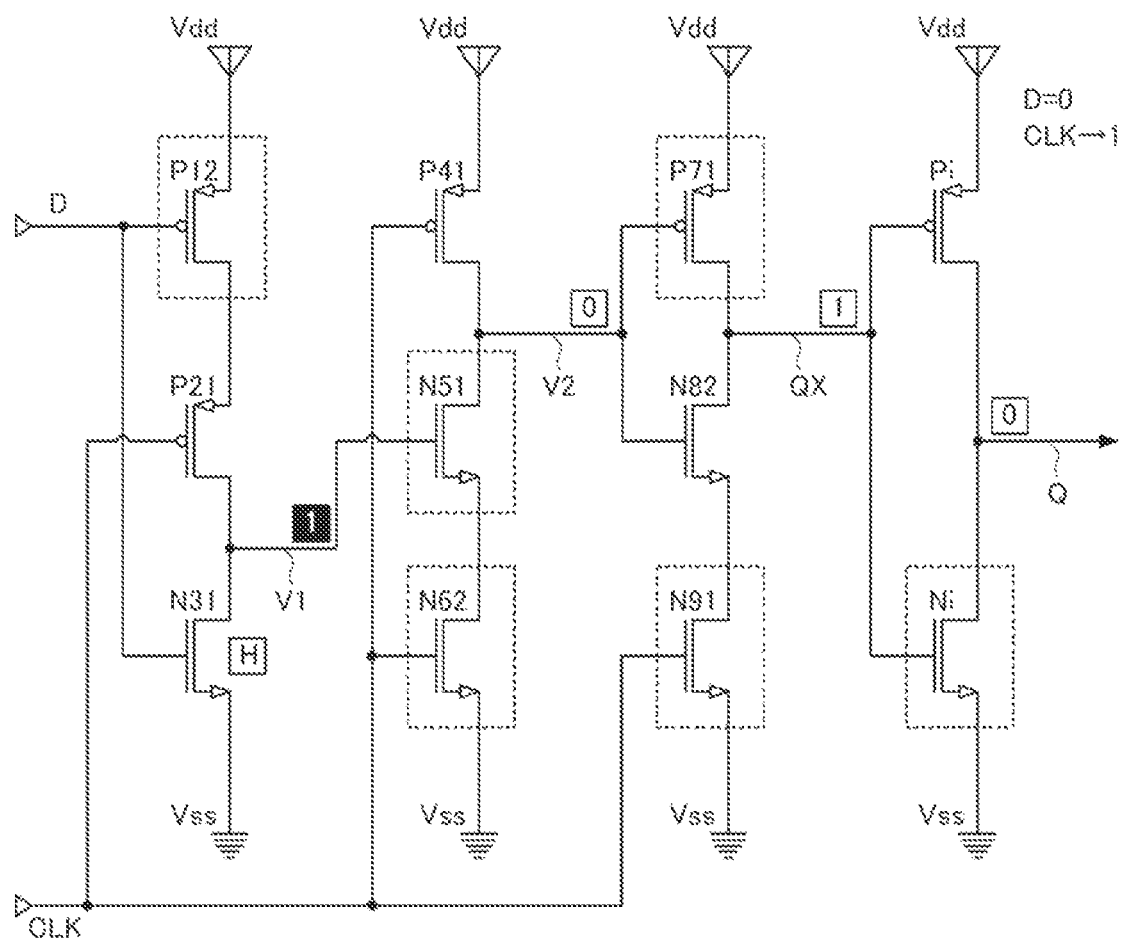
FIG. 5 is a diagram illustrating the flip-flop circuit.

(1-2-1) Threshold Voltage of Third and Ninth MOS Transistors:

After the state illustrated in FIG. 4, at a time point $T_{11}$, the state of the clock signal node CLK changes to 1 while the state of the input signal node D is maintained at 0. FIG. 5 illustrates the state of each node and the state of each transistor in this case. At the time point $T_{11}$, since the state of the input signal node D is 0 and the state of the clock signal node CLK is 1, the first MOS transistor P12 is turned on, the second MOS transistor P21 is turned off, and the third MOS transistor N31 is turned off. As a result, the output signal node V1 is in a state of not being electrically coupled to either the high potential node Vdd or the low potential node Vss. However, since the state of the output signal node V1 is 1 at a time point immediately before, the state of 1 is still held.

As described above, when the node is in the floating state, the potential of this node is not determined by the potential of the high potential node Vdd or the low potential node Vss. That is, when either the high potential node Vdd or the low potential node Vss is electrically coupled to the node, the potential of this node is determined to be equivalent to the potential of the high potential node Vdd or the low potential node Vss which is electrically coupled to this node. However, when the node is in the floating state in which neither the high potential node Vdd nor the low potential node Vss is electrically coupled to this node, the potential of the node is determined by the state of the immediately preceding node being held.

As described above, in the example illustrated in FIG. 5, the output signal node V1 is in a state of not being electrically coupled to either the high potential node Vdd or the low potential node Vss. Thus, 1 is held in the floating state. In FIG. 3, a floating state occurring at the output signal node V1 is indicated by an X mark (similarly applied to other nodes below).

In the example illustrated in FIG. 5, since the output signal node V1 is 1 in the floating state and the state of the clock signal node CLK is 1, the fourth MOS transistor P41 is turned off, the fifth MOS transistor N51 is turned on, and the sixth MOS transistor N62 is turned on. As a result, the output signal node V2 comes to being electrically coupled to the low potential node Vss, and the state of the output signal node V2 becomes 0.

Further, since the state of the output signal node V2 is 0 and the state of the clock signal node CLK is 1, the seventh MOS transistor P71 is turned on, the eighth MOS transistor N82 is turned off, and the ninth MOS transistor N91 is turned on. As a result, the output signal node QX comes to being electrically coupled to the high potential node Vdd. Thus, the state of the output signal node QX becomes 1. As a result, the state of the output signal node Q in the CMOS inverter circuit Inv becomes 0.

As described above, in the flip-flop circuit according to the present embodiment, when the state of the clock signal node CLK changes to 1 while the state of the input signal node D is maintained at 0, the output signal node V1 becomes 1 in the floating state. When such a floating state occurs, but the state is changed to a state other than the floating state in a short period, no problem occurs in information transmission between the gate circuits.

However, when the floating state is maintained for a long time, that is, when the frequency of the clock signal applied to the clock signal node CLK or the frequency of the input signal applied to the input signal node D becomes a low frequency, a state to be held in the floating state may vary. Specifically, even though the MOS transistor is in the OFF state, a leakage current may flow in the MOS transistor. Thus, even when the node is not electrically coupled to any of the high potential node Vdd and the low potential node Vss by being in the floating state, the potential of the node may fluctuate when the leakage current in the transistor flows for a long time.

Therefore, in the present embodiment, a configuration in which the threshold voltage of the transistor coupled to the node which may be in the floating state is higher than those of the other MOS transistors is made. That is, it is possible to change the threshold voltage by increasing or decreasing ion implantation amount in a transistor manufacturing process. In the present embodiment, two types of MOS transistors having different threshold voltages may be selected for P-type and N-type. As described above, the configuration in which two types of threshold voltages may be selected may be realized, for example, in a manner that, in a process of manufacturing the flip-flop circuit, an ion implantation process for forming the P-type MOS transistor is performed twice, an ion implantation process for forming the N-type MOS transistor is performed twice, and the ion implantation amount is changed in each process.

In the present embodiment, the PMOS transistor coupled to the node that may be in the floating state is configured by a MOS transistor having a higher threshold voltage. The NMOS transistor coupled to the node that may be in the floating state is configured by a MOS transistor having a higher threshold voltage. Specifically, in the present embodiment, two types of the PMOS transistor having threshold voltages of 0.65 V and 0.45 V may be selected. Two types of NMOS transistors having threshold voltages of 0.6 V and 0.4 V may be selected.

After the time point $T_{11}$, the output signal node V1 is 1 in the floating state as illustrated in FIG. 5. Thus, in order to hold the high potential indicating 1 at the output signal node V1, it is sufficient to prevent an occurrence of current leakage to the low potential node Vss. Therefore, in the present embodiment, the higher threshold voltage is selected as the threshold voltage of the third MOS transistor N31 provided between the low potential node Vss and the output signal node V1. In FIG. 5, H added to the third MOS transistor N31 indicates that a high threshold voltage is selected for this MOS transistor.

Figure 6:
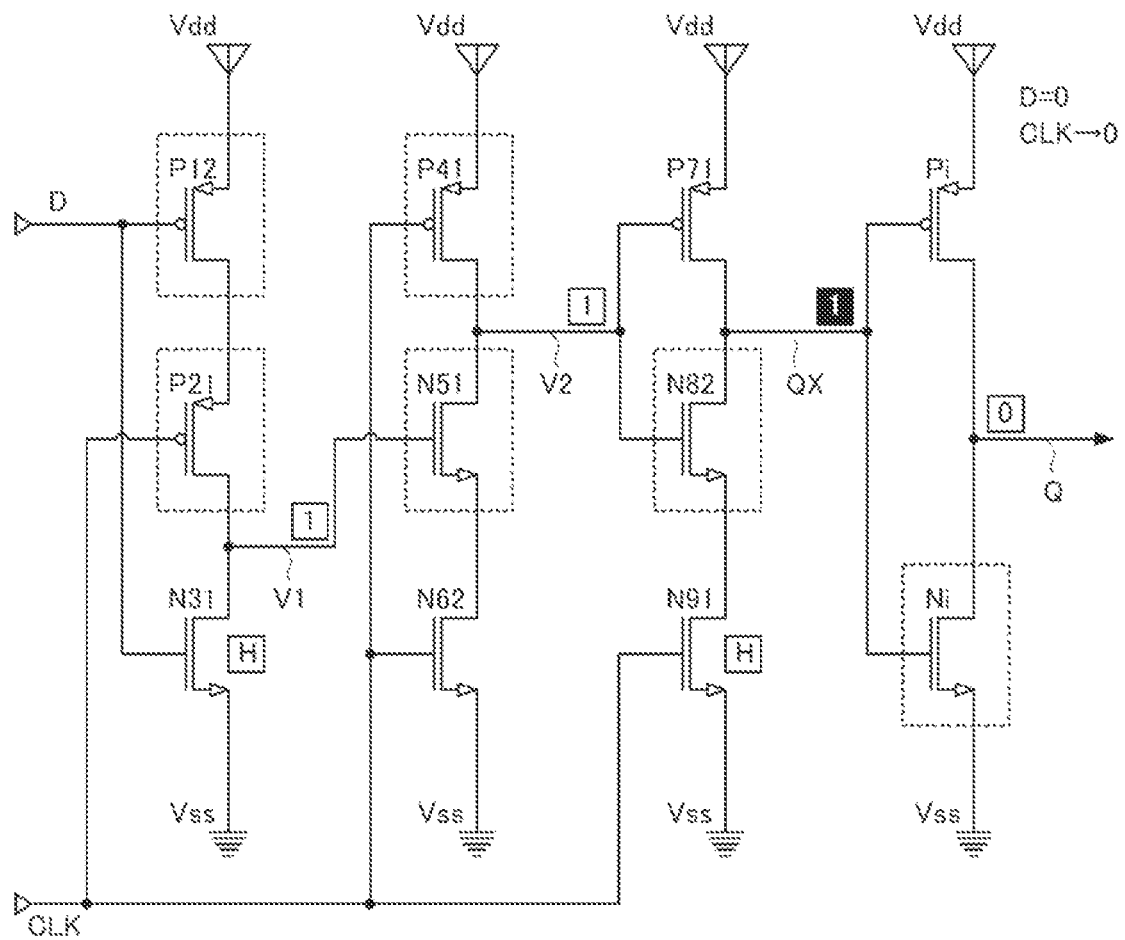
FIG. 6 is a diagram illustrating the flip-flop circuit.

At a time point $T_{12}$ after the time point $T_{11}$, the state of clock signal node CLK changes to 0 while the state of input signal node D is maintained at 0. FIG. 6 illustrates the state of each node and the state of each transistor in this case. At the time point $T_{12}$, since the state of the input signal node D is 0 and the state of the clock signal node CLK is 0, the first MOS transistor P12 is turned on, the second MOS transistor P21 is turned on, and the third MOS transistor N31 is turned off. As a result, the output signal node V1 is electrically coupled to the low potential node Vss, and the output signal node V1 is determined to 1.

In the example illustrated in FIG. 6, since the state of the output signal node V1 is 1 and the state of the clock signal node CLK is 0, the fourth MOS transistor P41 is turned on, the fifth MOS transistor N51 is turned on, and the sixth MOS transistor N62 is turned off. As a result, the output signal node V2 comes to being electrically coupled to the high potential node Vdd, and the state of the output signal node V2 becomes 1.

Further, since the state of the output signal node V2 is 1 and the state of the clock signal node CLK is 0, the seventh MOS transistor P71 is turned off, the eighth MOS transistor N82 is turned on, and the ninth MOS transistor N91 is turned off. As a result, the output signal node QX becomes in the floating state. Since the state of the output signal node QX immediately before the time point 112 is 1, the output signal node QX holds 1 in the floating state after the time point 112.

After the time point $T_{12}$, the output signal node QX is 1 in the floating state as illustrated in FIG. 6. Thus, in order to hold the high potential indicating 1 at the output signal node QX, it is sufficient to prevent an occurrence of current leakage to the low potential node Vss. Therefore, in the present embodiment, the higher threshold voltage is selected as the threshold voltage of the ninth MOS transistor N91 in the OFF state, between the low potential node Vss and the output signal node QX. In FIG. 6, H added to the ninth MOS transistor N91 indicates that a high threshold voltage is selected for this MOS transistor.

As described above, in the present embodiment, the higher threshold voltage is selected as the threshold voltages of the third and ninth MOS transistors. Therefore, it is possible to suppress flowing of a leakage current in the floating state caused by the change of the state of the clock signal node CLK in a period in which the state of the input signal node D is 0 as in a period of the time points $T_1$ to $T_2$ in FIG. 3. As a result, it is possible to provide a flip-flop circuit enabled to be operated at a low speed without providing a level fixing unit. Thus, it is possible to reduce a circuit size and current consumption in comparison to a configuration in which the level fixing unit is provided.

Figure 7:
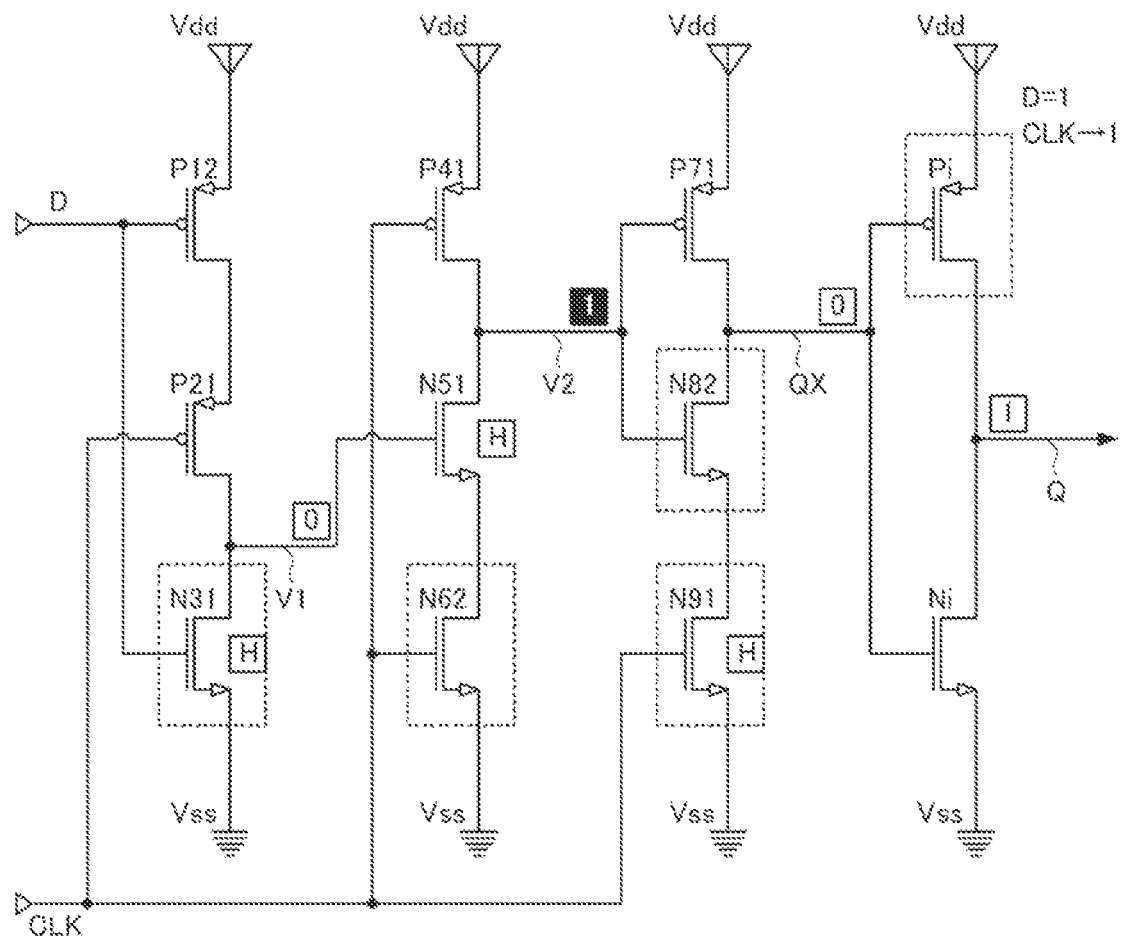
FIG. 7 is a diagram illustrating the flip-flop circuit.

(1-2-2) Threshold Voltage of Fifth and Seventh MOS Transistors:

Next, a case where the state of the input signal node D changes to 1 at the time point $T_2$ and then the state of the clock signal node CLK changes from 0 to 1 at a time point 121 will be described. At the time point $T_{21}$, the state of the input signal node D is 1, and the state of the clock signal node CLK changes to 1. FIG. 7 illustrates the state of each node and the state of each transistor in this case. At the time point $T_{21}$, since the state of the input signal node D is 1 and the state of the clock signal node CLK is 1, the first MOS transistor P12 is turned off, the second MOS transistor P21 is turned off, and the third MOS transistor N31 is turned on. As a result, the output signal node V1 comes to being electrically coupled to the low potential node Vss, and the state of the output signal node V1 becomes 0.

In the example illustrated in FIG. 7, since the state of the output signal node V1 is 0 and the state of the clock signal node CLK is 1, the fourth MOS transistor P41 is turned off, the fifth MOS transistor N51 is turned off, and the sixth MOS transistor N62 is turned on. Thus, the output signal node V2 becomes in the floating state without being electrically coupled to either the high potential node Vdd or the low potential node Vss. Since the state of the output signal node V2 immediately before the time point $T_{21}$ is 1, the output signal node V2 holds 1 in the floating state after the time point $T_{21}$.

Further, since the state of the output signal node V2 is 1 and the state of the clock signal node CLK is 1, the seventh MOS transistor P71 is turned off, the eighth MOS transistor N82 is turned on, and the ninth MOS transistor N91 is turned on. As a result, the output signal node QX comes to being electrically coupled to the low potential node Vss. Therefore, the state of the output signal node QX becomes 0. As a result, the state of the output signal node Q of the CMOS inverter circuit Inv becomes 1.

At the time point $T_{21}$, the output signal node V2 is 1 in the floating state as illustrated in FIG. 7. Thus, in order to hold the high potential indicating 1 at the output signal node V2, it is sufficient to prevent an occurrence of current leakage to the low potential node Vss. Therefore, in the present embodiment, the higher threshold voltage is selected as the threshold voltage of the fifth MOS transistor N51. In FIG. 7, H added to the fifth MOS transistor N51 indicates that a high threshold voltage is selected for this MOS transistor.

Figure 8:
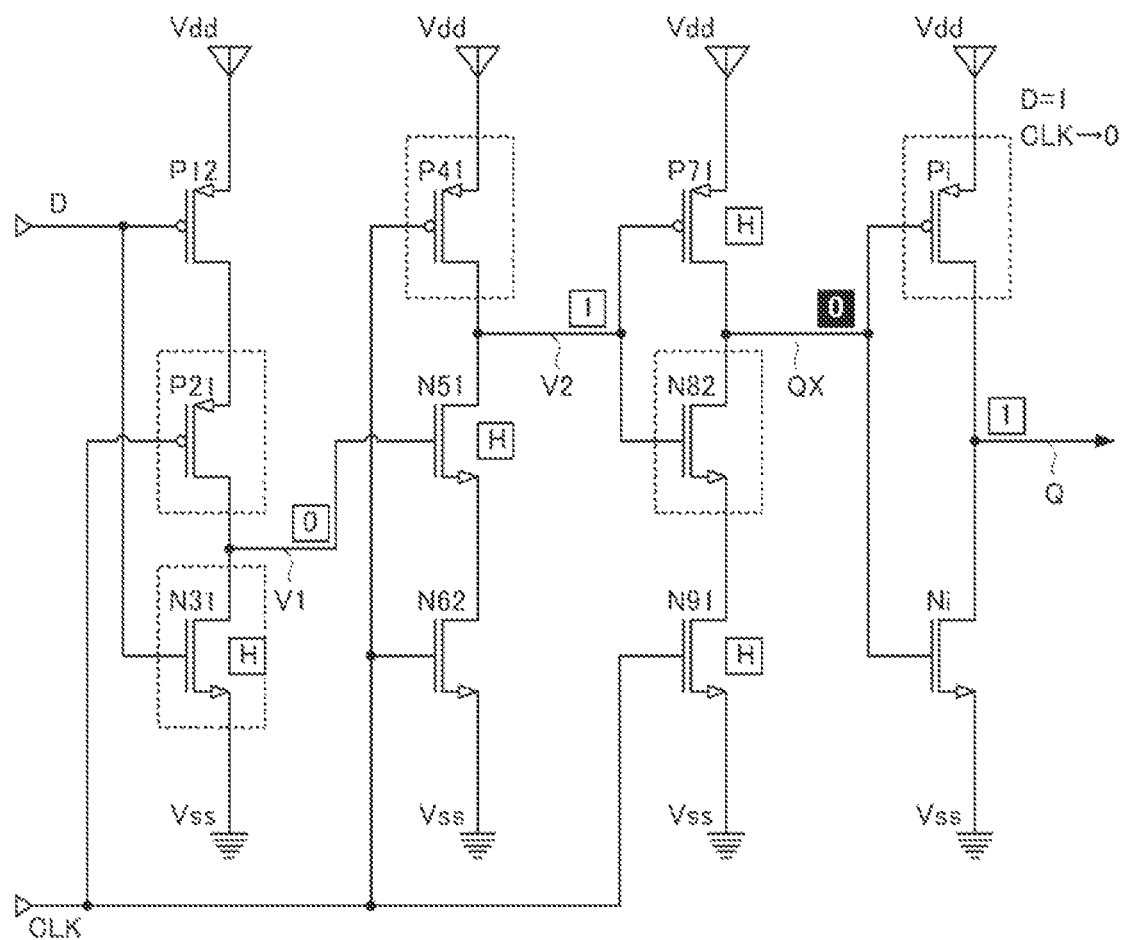
FIG. 8 is a diagram illustrating the flip-flop circuit.

At a time point $T_{22}$ after the time point $T_{21}$, the state of clock signal node CLK changes to 0 while the state of input signal node D is maintained at 1. FIG. 8 illustrates the state of each node and the state of each transistor in this case. At the time point $T_{22}$, since the state of the input signal node D is 1 and the state of the clock signal node CLK is 0, the first MOS transistor P12 is turned off, the second MOS transistor P21 is turned on, and the third MOS transistor N31 is turned on. As a result, the output signal node V1 is electrically coupled to the low potential node Vss, and the output signal node V1 is determined to 0.

In the example illustrated in FIG. 8, since the state of the output signal node V1 is 0 and the state of the clock signal node CLK is 0, the fourth MOS transistor P41 is turned on, the fifth MOS transistor N51 is turned off, and the sixth MOS transistor N62 is turned off. As a result, the output signal node V2 comes to being electrically coupled to the high potential node Vdd, and the state of the output signal node V2 becomes 1.

Further, since the state of the output signal node V2 is 1 and the state of the clock signal node CLK is 0, the seventh MOS transistor P71 is turned off, the eighth MOS transistor N82 is turned on, and the ninth MOS transistor N91 is turned off. As a result, the output signal node QX becomes in the floating state. Since the state of the output signal node QX immediately before the time point 122 is 0, the output signal node QX holds 0 in the floating state after the time point $T_{22}$.

After the time point $T_{22}$, the output signal node QX is 0 in the floating state as illustrated in FIG. 8. Therefore, in order to hold the low potential indicating 0 at the output signal node QX, it is sufficient to prevent an occurrence of current leakage from the high potential node Vdd. Therefore, in the present embodiment, the higher threshold voltage is selected as the threshold voltage of the seventh MOS transistor P71 in the OFF state, between the high potential node Vdd and the output signal node QX. In FIG. 8, H added to the seventh MOS transistor P71 indicates that a high threshold voltage is selected for this MOS transistor.

As described above, in the present embodiment, the higher threshold voltage is selected as the threshold voltages of the fifth and seventh MOS transistors. Therefore, it is possible to suppress flowing of a leakage current in the floating state caused by the change of the state of the clock signal node CLK in a period in which the state of the input signal node D is 1 as in a period of the time points $T_2$ to $T_3$ in FIG. 3. As a result, it is possible to provide a flip-flop circuit enabled to be operated at a low speed without providing a level fixing unit. Thus, it is possible to reduce a circuit size and current consumption in comparison to a configuration in which the level fixing unit is provided.

Figure 9:
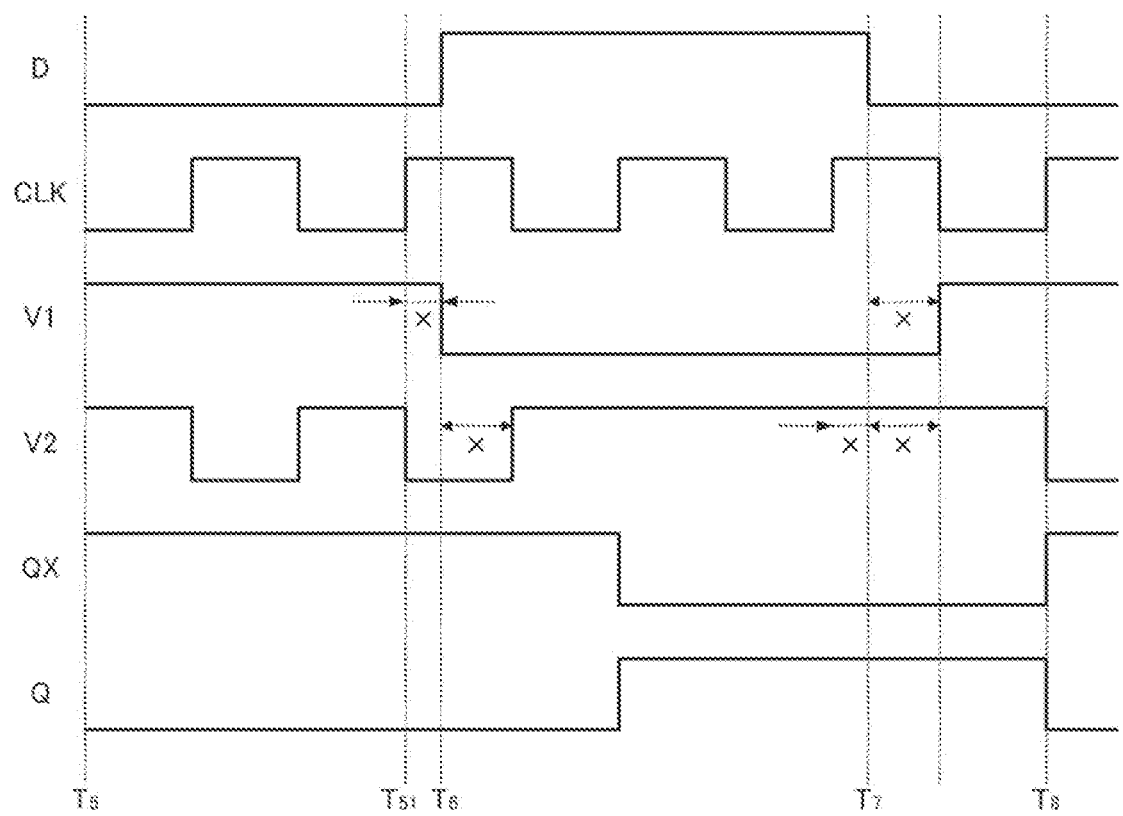
FIG. 9 is a timing chart illustrating the flip-flop circuit.

(1-2-3) Threshold Voltages of Second and Fourth MOS Transistors:

The above example is a countermeasure for the floating state that occurs when the state of the clock signal node CLK changes while the state of the input signal node D is maintained. A countermeasure for a case where the floating state occurs when the state of the input signal node D changes while the state of the clock signal node CLK is maintained may be made. FIG. 9 is a timing chart illustrating the operation of the flip-flop circuit when the state of the input signal node D changes while the state of the clock signal node CLK is maintained.

At a time point $T_5$, the state of the input signal node D is 0. Then, it is assumed that the state of the input signal node D changes to 1 at a time point $T_6$ and then the state of the input signal node D changes to 0 at a time point $T_7$. In this example, the state of the clock signal node CLK is 1 at times points $T_6$ and $T_7$ when the state of the input signal node D changes. A time point $T_8$ is a time point at which the state of the clock signal node CLK changes from 0 to 1 for the first time after the time $T_7$.

Figure 10:
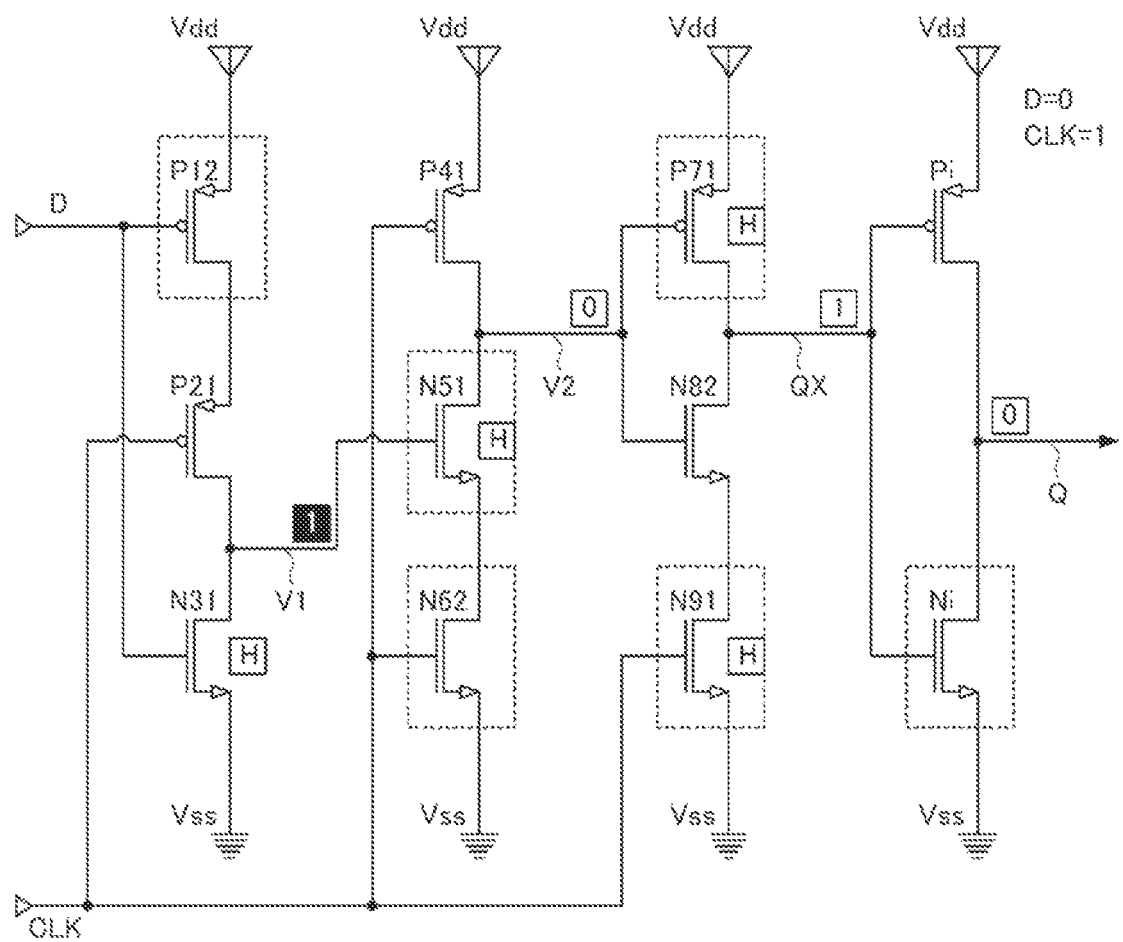
FIG. 10 is a diagram illustrating the flip-flop circuit.

FIG. 10 illustrates the state of each node and the state of each transistor in the flip-flop circuit after a time point $T_{51}$. A case where the state of the clock signal node CLK changes to 1 at a time point $T_{51}$ and then the state of the input signal node D changes from 0 to 1 at the time point $T_6$ will be described with reference to FIG. 10. At the time point $T_{51}$, since the state of the input signal node D is 0 and the state of the clock signal node CLK is 1, the first MOS transistor P12 is turned on, the second MOS transistor P21 is turned off, and the third MOS transistor N31 is turned off. As a result, the output signal node V1 becomes in the floating state in which the output signal node V1 is not electrically coupled to either the high potential node Vdd or the low potential node Vss. In this case, since the output signal node V1 holds the previous state, the output signal node V1 holds 1 in the floating state.

In the example illustrated in FIG. 10, since the state of the output signal node V1 is 1 and the state of the clock signal node CLK is 1, the fourth MOS transistor P41 is turned off, the fifth MOS transistor N51 is turned on, and the sixth MOS transistor N62 is turned on. Therefore, the output signal node V2 is electrically coupled to the low potential node Vss, and the state becomes 0.

Further, since the state of the output signal node V2 is 0 and the state of the clock signal node CLK is 1, the seventh MOS transistor P71 is turned on, the eighth MOS transistor N82 is turned off, and the ninth MOS transistor N91 is turned on. As a result, the output signal node QX comes to being electrically coupled to the high potential node Vdd. Thus, the state of the output signal node QX becomes 1. As a result, the state of the output signal node Q in the CMOS inverter circuit Inv becomes 0. After the time point $T_{51}$, the output signal node V1 is 1 in the floating state as illustrated in FIG. 10. Accordingly, similar to the case of FIG. 5 described above, it is preferable to increase the threshold voltage of the third MOS transistor N31.

Figure 11:
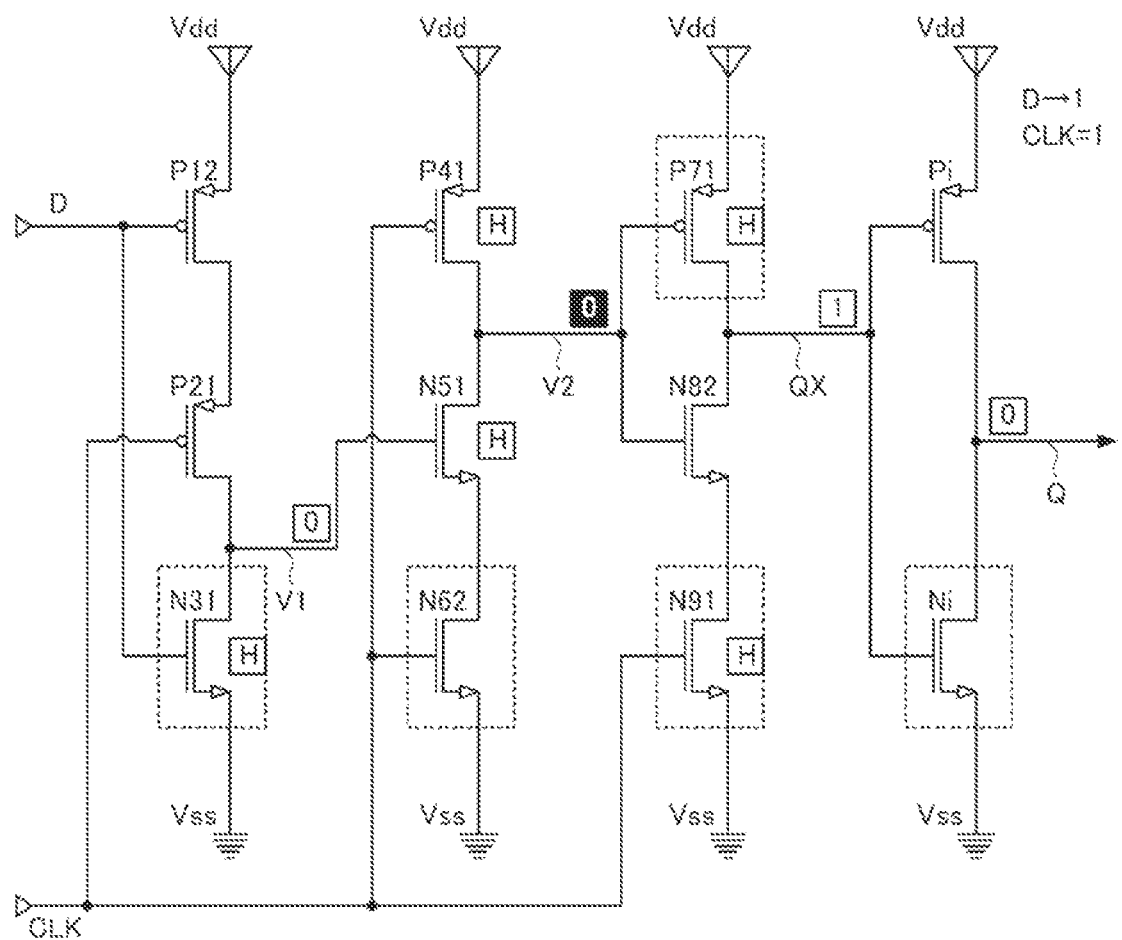
FIG. 11 is a diagram illustrating the flip-flop circuit.

At the time point $T_6$ after the time point $T_{51}$, the state of the input signal node D changes to 1 while the state of the clock signal node CLK is maintained at 1. FIG. 11 illustrates the state of each node and the state of each transistor in this case. At the time point 16, since the state of the input signal node D is 1 and the state of the clock signal node CLK is 1, the first MOS transistor P12 is turned off, the second MOS transistor P21 is turned off, and the third MOS transistor N31 is turned on. As a result, the output signal node V1 is electrically coupled to the low potential node Vss, and the output signal node V1 is determined to 0.

In the example illustrated in FIG. 11, since the state of the output signal node V1 is 0 and the state of the clock signal node CLK is 1, the fourth MOS transistor P41 is turned off, the fifth MOS transistor N51 is turned off, and the sixth MOS transistor N62 is turned on. As a result, the output signal node V2 becomes in the floating state in which the output signal node V2 is not electrically coupled to either the high potential node Vdd or the low potential node Vss. In this case, since the output signal node V2 holds the previous state, the output signal node V2 holds 0 in the floating state.

Further, since the state of the output signal node V2 is 0 and the state of the clock signal node CLK is 1, the seventh MOS transistor P71 is turned on, the eighth MOS transistor N82 is turned off, and the ninth MOS transistor N91 is turned on. As a result, the output signal node QX is electrically coupled to the high potential node Vdd, and the output signal node QX is determined to 1.

After the time point 16, the output signal node V2 is 0 in the floating state as illustrated in FIG. 11. Therefore, in order to hold the low potential indicating 0 at the output signal node V2, it is sufficient to prevent an occurrence of current leakage from the high potential node Vdd. Therefore, in the present embodiment, the higher threshold voltage is selected as the threshold voltage of the fourth MOS transistor P41 in the OFF state, between the high potential node Vdd and the output signal node V2. In FIG. 11, H added to the fourth MOS transistor P41 indicates that a high threshold voltage is selected for this MOS transistor.

Figure 12:
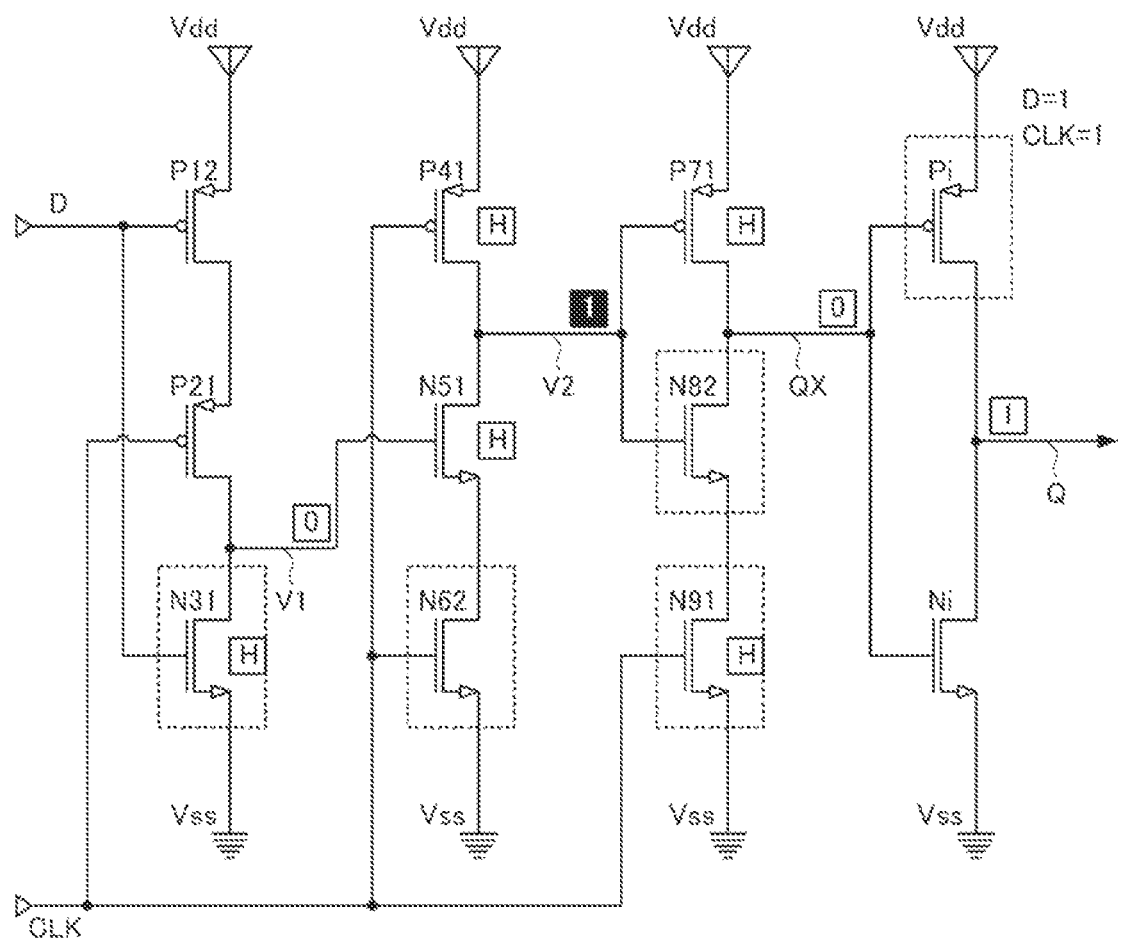
FIG. 12 is a diagram illustrating the flip-flop circuit.

FIG. 12 illustrates the state immediately before the time point 17 illustrated in FIG. 9. Immediately before the time point 17, since the state of the input signal node D is 1 and the state of the clock signal node CLK is 1, the first MOS transistor P12 is turned off, the second MOS transistor P21 is turned off, and the third MOS transistor N31 is turned on. As a result, the output signal node V1 is electrically coupled to the low potential node Vss, and the output signal node V1 is determined to 0.

In the example illustrated in FIG. 12, since the state of the output signal node V1 is 0 and the state of the clock signal node CLK is 1, the fourth MOS transistor P41 is turned off, the fifth MOS transistor N51 is turned off, and the sixth MOS transistor N62 is turned on. As a result, the output signal node V2 becomes in the floating state in which the output signal node V2 is not electrically coupled to either the high potential node Vdd or the low potential node Vss. In this case, since the output signal node V2 holds the previous state, the output signal node V2 holds 1 in the floating state.

Further, since the state of the output signal node V2 is 1 and the state of the clock signal node CLK is 1, the seventh MOS transistor P71 is turned off, the eighth MOS transistor N82 is turned on, and the ninth MOS transistor N91 is turned on. As a result, the output signal node QX comes to being electrically coupled to the low potential node Vss. Therefore, the state of the output signal node QX becomes 0. As a result, the state of the output signal node Q of the CMOS inverter circuit Inv becomes 1. After the time point $T_7$, the output signal node V2 is 1 in the floating state as illustrated in FIG. 12. Accordingly, similar to the case of FIG. 7 described above, it is preferable to increase the threshold voltage of the fifth MOS transistor N51.

Figure 13:
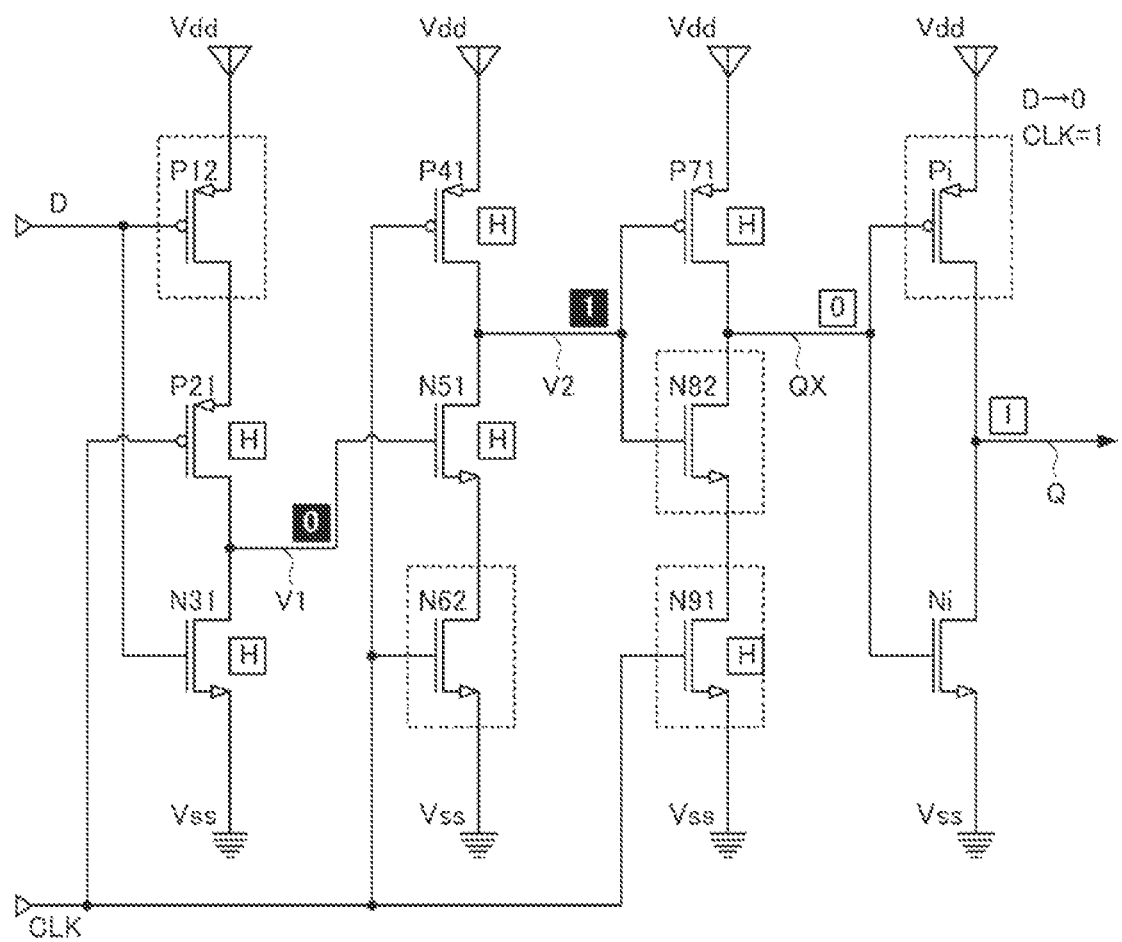
FIG. 13 is a diagram illustrating the flip-flop circuit.

At the time point $T_7$, the state of input signal node D changes to 0 while the state of clock signal node CLK is maintained at 1. FIG. 13 illustrates the state of each node and the state of each transistor in this case. After the time point $T_7$, since the state of the input signal node D is 0 and the state of the clock signal node CLK is 1, the first MOS transistor P12 is turned on, the second MOS transistor P21 is turned off, and the third MOS transistor N31 is turned off. As a result, the output signal node V1 becomes in the floating state in which the output signal node V1 is not electrically coupled to either the high potential node Vdd or the low potential node Vss. In this case, since the output signal node V1 holds the previous state, the output signal node V1 holds 0 in the floating state.

In the example illustrated in FIG. 13, since the state of the output signal node V1 is 0 and the state of the clock signal node CLK is 1, the fourth MOS transistor P41 is turned off, the fifth MOS transistor N51 is turned off, and the sixth MOS transistor N62 is turned on. As a result, the output signal node V2 becomes in the floating state in which the output signal node V2 is not electrically coupled to either the high potential node Vdd or the low potential node Vss. In this case, since the output signal node V2 holds the previous state, the output signal node V2 holds 1 in the floating state.

Further, since the state of the output signal node V2 is 1 and the state of the clock signal node CLK is 1, the seventh MOS transistor P71 is turned off, the eighth MOS transistor N82 is turned on, and the ninth MOS transistor N91 is turned on. As a result, the output signal node QX is electrically coupled to the low potential node Vss, and the output signal node QX is determined to 0.

After the time point 17, the output signal node V1 is 0 in the floating state as illustrated in FIG. 13. Therefore, in order to hold the low potential indicating 0 at the output signal node V1, it is sufficient to prevent an occurrence of current leakage from the high potential node Vdd. Therefore, in the present embodiment, the higher threshold voltage is selected as the threshold voltage of the second MOS transistor P21 in the OFF state, between the high potential node Vdd and the output signal node V1. In FIG. 13, H added to the second MOS transistor P21 indicates that a high threshold voltage is selected for this MOS transistor. In the state illustrated in FIG. 13, the output signal node V2 is 1 in the floating state. Accordingly, similar to the case of FIG. 7 described above, it is preferable to increase the threshold voltage of the fifth MOS transistor N51.

As described above, in the present embodiment, the higher threshold voltage is selected as the threshold voltages of the second and fourth MOS transistors. Therefore, it is possible to suppress flowing of a leakage current in the floating state caused by the change of the state of the input signal node D in a period in which the state of the clock signal node CLK is 1 as at the time points $T_6$ and $T_7$ in FIG. 9. As a result, it is possible to provide a flip-flop circuit enabled to be operated at a low speed without providing a level fixing unit. Thus, it is possible to reduce a circuit size and current consumption in comparison to a configuration in which the level fixing unit is provided.

With the above configuration, in the flip-flop circuit according to the present embodiment, as illustrated in FIG. 13, the threshold voltages of the second, fourth, and seventh MOS transistors P21, P41, P71 are higher than the threshold voltage of the first MOS transistor P12. The threshold voltages of the third, fifth, and ninth MOS transistors N31, N51, N91 are higher than the threshold voltages of the sixth and eighth MOS transistors N62 and N82. Specifically, the threshold voltages of the second, fourth, and seventh PMOS transistors P21, P41, P71 are 0.65 V. The threshold voltages of the third, fifth, and ninth NMOS transistors N31, N51, N91 are 0.6 V. The threshold voltage of the first PMOS transistor P12 is 0.45 V. The threshold voltages of the sixth and eighth NMOS transistors N62 and N82 are 0.4 V.

In the present embodiment, the MOS transistor that is in the OFF state when the potential of the output signal node that outputs the output signal is held is classified into a first MOS transistor group. The MOS transistors other than the first MOS transistor, that is, the MOS transistors that are in the ON state when the potential of the output signal node is held are classified into a second MOS transistor group. Specifically, the second, third, fourth, fifth, seventh, and ninth MOS transistors P21, N31, P41, N51, P71, and N91 which are MOS transistors for which a relatively high threshold voltage is selected are classified into the first MOS transistor group. The first, sixth, and eighth MOS transistors which are the MOS transistors for which the relatively low threshold voltage is selected are classified into the second MOS transistor group.

In the present embodiment, one MOS transistors classified into the first MOS transistor group is provided on each of the high potential node side and the low potential node side when viewed from the output signal nodes V1, V2 and QX. That is, one MOS transistor in each of the first to third gate circuits G1 to G3 illustrated in FIG. 2 is classified into the first MOS transistor group such that the classified MOS transistors interpose the output signal nodes V1, V2 and QX.

Specifically, when one MOS transistor is provided when the high potential node side or the low potential node side is viewed from the output signal nodes V1, V2, QX, the one MOS transistor is classified into the first MOS transistor group. For example, in the first gate circuit G1, one third MOS transistor N31 is provided at the low potential node Vss side when viewed from the output signal node V1. The third MOS transistor N31 is classified into the first MOS transistor group, and is configured by a MOS transistor having a high threshold voltage.

In a case where two MOS transistors are provided when the high potential node side or the low potential node side is viewed from the output signal nodes V1, V2, QX, any one of the two MOS transistors is classified into the first MOS transistor group. For example, in the first gate circuit G1, two transistors being the second MOS transistor P21 and first MOS transistor P12 are provided at the high potential node Vdd side when viewed from the output signal node V1. The second MOS transistor P21 which is one of the two transistors is classified into the first MOS transistor group.

As described above, in the present embodiment, when the MOS transistor classified into the first MOS transistor group is selected from the two MOS transistors provided at one side when viewed from the output signal node, selection is performed such that different input signals are input to the two MOS transistors that interpose the output signal node. That is, in the first to third gate circuits G1 to G3, different signals are input to the gates of the MOS transistors forming the first MOS transistor group.

For example, the two MOS transistors that belong to the first MOS transistor group and interpose the output signal node V1 are the second MOS transistor P21 and the third MOS transistor N31. The clock signal node CLK is coupled to the gate of the second MOS transistor P21, the input signal node D is coupled to the gate of the third MOS transistor N31, and signals different from each other are input.

The two MOS transistors that belong to the first MOS transistor group and interpose the output signal node V2 are the fourth MOS transistor P41 and the fifth MOS transistor N51. The clock signal node CLK is coupled to the gate of the fourth MOS transistor P41, the output signal node V1 is coupled to the gate of the fifth MOS transistor N51, and signals different from each other are input.

The two MOS transistors that belong to the first MOS transistor group and interpose the output signal node QX are the seventh MOS transistor P71 and the ninth MOS transistor N91. The clock signal node CLK is coupled to the gate of the ninth MOS transistor N91, the output signal node V2 is coupled to the gate of the seventh MOS transistor P71, and signals different from each other are input.

According to the above-described configuration, it is possible to classify the MOS transistor that operates with different input signals into the first MOS transistor group, among the MOS transistors controlling the electrical coupling of the high potential node Vdd and the low potential node Vss to the output signal node which may be in the floating state. This, it is possible to suppress generation of the leakage current to the high potential node Vdd and the low potential node Vss.

According to the above configuration, since the threshold voltage of the first MOS transistor group is set to be higher than the threshold voltage of the second MOS transistor group, it is possible to suppress flowing of the leakage current in the floating state, and thus to provide a flip-flop circuit that does not perform an erroneous operation even though the flip-flop circuit operates at a low speed.

In the circuit illustrated in FIG. 13, when all the MOS transistors are configured by MOS transistors having a small threshold voltage, it is possible to form a known TSPC flip-flop circuit capable of operating at a high speed. Comparing such a known TSPC flip-flop circuit with the flip-flop circuit according to the present embodiment, the known flip-flop circuit can operate at high speed, but the minimum frequency is high. That is, in the known TSPC flip-flop circuit, it is not possible to operate at a low speed and to hold 1 or 0 in the floating state for a long period. However, in the flip-flop circuit according to the present embodiment, the minimum frequency is lower than that in the known type, and thus it is possible to operate at the low speed. Therefore, the flip-flop circuit according to the present embodiment has a wider application range at a frequency lower than that in the known TSPC flip-flop circuit.

The flip-flop circuit also has a configuration called the Static type. The Static flip-flop circuit has an advantage that it is possible to hold the state even though the clock signal is stopped at any timing. However, the TSPC flip-flop circuit according to the present embodiment has advantages that it is possible to operate at a higher speed, an operation current is smaller, and a circuit size is smaller, than those in the Static flip-flop circuit.

Table 1 shows the comparison of typical specifications of the flip-flop circuit according to the present embodiment, the known TSPC flip-flop circuit, and the Static flip-flop circuit.

TABLE 1

|  | Embodiment F/F | Known TSPC-F/F | Static F/F |
|---|---|---|---|
| Maximum frequency (MHz) | 1500 | 2200 | 600 |
| Minimum frequency (MHz) | 0.2 | 300 | 0 |
| Operation current (µA) | 13 | 12 | 40 |
| Maximum delay time (ps) (rising) | 218 | 180 | 672 |
| Maximum delay time (ps) (falling) | 225 | 154 | 591 |

Table 1 shows the specifications when a power source of 1.8 V (±0.1 V) is coupled to the high potential node Vdd of each flip-flop circuit, and the low potential node Vss is coupled to the ground. The operating temperature is assumed to be −40 degrees to 140 degrees. The maximum frequency is the maximum frequency in a latch operation, and the minimum frequency is the minimum frequency in the latch operation. The operation current is the current in a toggle operation at 200 MHz. The maximum delay time is the time required from the change of the clock signal to the change of the state of the output signal node Q, and is shown for each rising and falling of the output signal node Q.

As shown in Table 1, the flip-flop circuit according to the present embodiment can operate at 0.2 MHz to 1500 MHz, but the known TSPC flip-flop circuit can operate at 300 MHz to 2200 MHz. As described above, the flip-flop circuit according to the present embodiment has a wider operable frequency bandwidth at the low frequency side than that in the known TSPC flip-flop circuit. Comparing the flip-flop circuit according to the present embodiment with the Static flip-flop circuit, the flip-flop circuit according to the present embodiment has a wide operable frequency bandwidth at the high frequency side.

The operation current in the flip-flop circuit according to the present embodiment is equivalent to that in the known TSPC flip-flop circuit. The operation current in the flip-flop circuit according to the present embodiment is smaller than that in the Static flip-flop circuit. The known TSPC flip-flop circuit, the flip-flop circuit according to the present embodiment, and the Static flip-flop circuit have the maximum delay time in ascending order.

According to the flip-flop circuit according to the present embodiment, since analog elements such as resistors, capacitors and inductors are not used, it is possible to easily generate a regular logic array. Thus, it is possible to perform easy application to automatic placement and routing. Therefore, it is possible to design a circuit including the flip-flop circuit according to the present embodiment in a short time.

(2) Other Embodiments

The above embodiment is an example for embodying the present disclosure, and various other embodiments can be adopted. The application target of the flip-flop circuit according to the embodiment of the present disclosure is not limited, and the flip-flop circuit can be used in various devices such as various electronic devices and various electric components of vehicles.

Furthermore, various changes may be made to the elements and circuits that form the above-described embodiment. For example, at least one of the tenth MOS transistor Pi and the eleventh MOS transistor Ni forming the CMOS inverter circuit Inv may be a MOS transistor having a high threshold voltage. Further, both MOS transistors may have a low threshold voltage.

In the above-described embodiment, all the six MOS transistors classified into the first MOS transistor group are MOS transistors having a high threshold voltage. However, the threshold voltage of at least one of the transistors belonging to the first MOS transistor group may be higher than the threshold voltages of the MOS transistors in the second MOS transistor group. For example, a configuration in which, among the transistors belonging to the first MOS transistor group, the threshold voltages of the second and fourth MOS transistors P21 and P41 are high, and the threshold voltages of the other MOS transistors are low may be adopted. That is, a configuration of suppressing the leakage current when the output signal node V2 holds 0 in the floating state (FIG. 11) and the leakage current when the output signal node V1 holds 0 in the floating state (FIG. 13) may be made.

According to this configuration, as illustrated in FIG. 9, it is possible to increase a possibility of the state of the node being held in the floating state caused by the change of the state of the input signal node D when the clock signal node CLK is 1. The flip-flop circuit according to such an example is preferably applied to, for example, a divider-by-two circuit as illustrated in FIG. 14.

Figure 14:
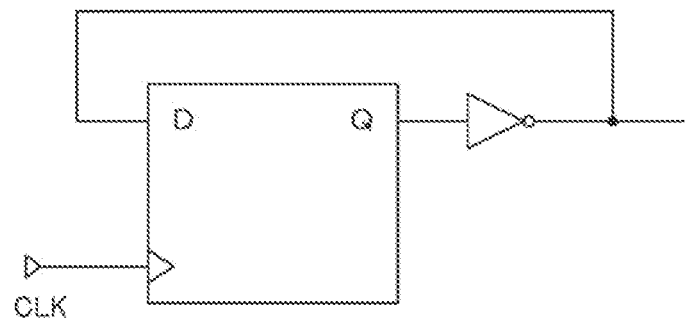
FIG. 14 is a diagram illustrating a configuration example of a divider-by-two circuit.

That is, according to the divider-by-two circuit illustrated in FIG. 14, the state of the input signal node D normally changes after the rising edge of the clock signal node CLK. In the example illustrated in FIG. 9, the state of the input signal node D changes at timings such as the time points $T_6$ and $T_7$. Therefore, when the threshold voltages of the second and fourth MOS transistors P21 and P41 among the transistors belonging to the first MOS transistor group are high, there is a low possibility of performing an erroneous operation even though the flip-flop circuit operates at the low speed.

As in the timing chart illustrated in FIG. 3, a usage form in which the operation of the flip-flop circuit is guaranteed when the state of the input signal node D is in the configuration in which the state of the input signal node D changes while the state of the clock signal node CLK is 0 is also assumed. In this case, as illustrated in FIGS. 5 and 6, a configuration in which the threshold voltages of the third and ninth MOS transistors N31 and N91 are high and the threshold voltages of the other MOS transistors are low may be adopted. According to this configuration, the operation of the flip-flop circuit is guaranteed when the state of the input signal node D is 0.

As in the timing chart illustrated in FIG. 3, a usage form in which the operation of the flip-flop circuit is guaranteed when the state of the input signal node D is in the configuration in which the state of the input signal node D changes while the state of the clock signal node CLK is 0 is also assumed. In this case, as illustrated in FIGS. 7 and 8, a configuration in which the threshold voltages of the fifth and seventh MOS transistors N51 and P71 are high and the threshold voltages of the other MOS transistors are low may be adopted. According to this configuration, the operation of the flip-flop circuit is guaranteed when the state of the input signal node D is 1.

The threshold voltages of the second and fourth MOS transistors P21 and P41 and the threshold voltages of one or more of the other transistors in the first MOS transistor group may be high. The threshold voltages of the third and ninth MOS transistors N31 and N91 and the threshold voltages of one or more of the other transistors in the first MOS transistor group may be high. The threshold voltages of the fifth and seventh MOS transistors N51 and P71 and the threshold voltages of one or more of the other transistors in the first MOS transistor group may be high. The present disclosure is not limited to thereto. A case where the threshold voltage of only one MOS transistor in the first MOS transistor group is set to be high depending on the application of the flip-flop circuit may also be assumed. For example, the threshold voltage of the fourth MOS transistor P41 may be set to be high when it is desired to particularly suppress the leakage current when the output signal node V2 holds 0 in the floating state (FIG. 11).

Figure 15:
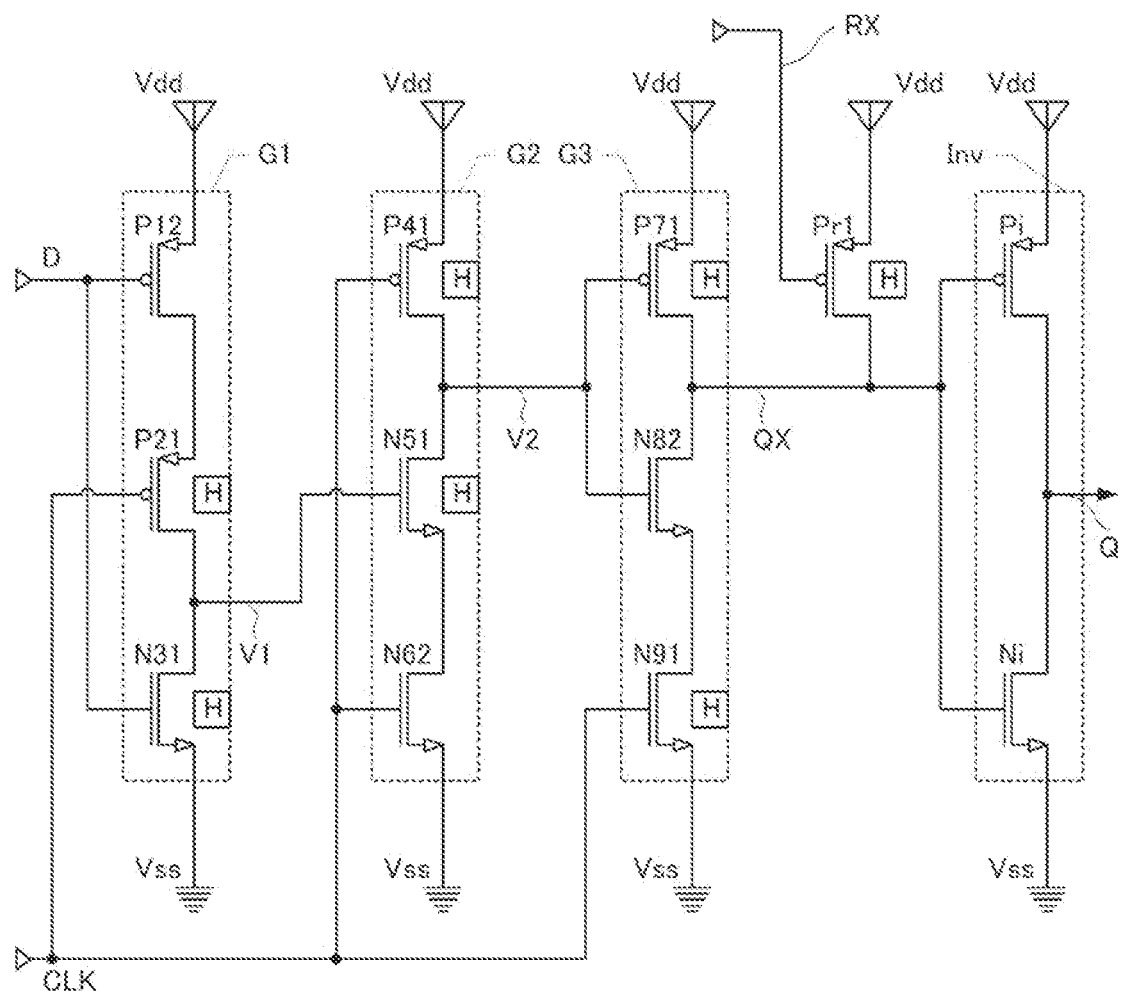
FIG. 15 is a diagram illustrating a flip-flop circuit.

Further, the flip-flop circuit may be configured to be resettable. Such a configuration may be realized by adding a reset MOS transistor Pr1 provided between the output signal node QX of the third gate circuit G3 and the high potential node Vdd to the above-described configuration illustrated in FIG. 2, as illustrated in FIG. 15. The reset MOS transistor Pr1 is a PMOS transistor. According to this configuration, the reset MOS transistor Pr1 is turned on when the state of a reset node RX is 0 and the state of the clock signal node CLK is 0. As a result, the state of the output signal node Q of the CMOS inverter circuit Inv becomes 0. Thus, it is possible to provide a flip-flop circuit capable of being reset by controlling the state of the reset node RX.

Focusing on the third gate circuit G3 in the flip-flop circuit illustrated in FIG. 15, the output signal node QX may be in the floating state, similar to the above-described embodiment. When the state of the reset node RX becomes 1 and the reset MOS transistor Pr1 is turned off even though the reset MOS transistor Pr1 is added as illustrated in FIG. 15, the output signal node QX becomes in the floating state. Therefore, the threshold voltage of the reset MOS transistor Pr1 is preferably higher than the threshold voltage of the first MOS transistor P12 being a PMOS transistor. In FIG. 15, H added to the reset MOS transistor Pr1 indicates that a high threshold voltage is selected for this MOS transistor.

Figure 16:
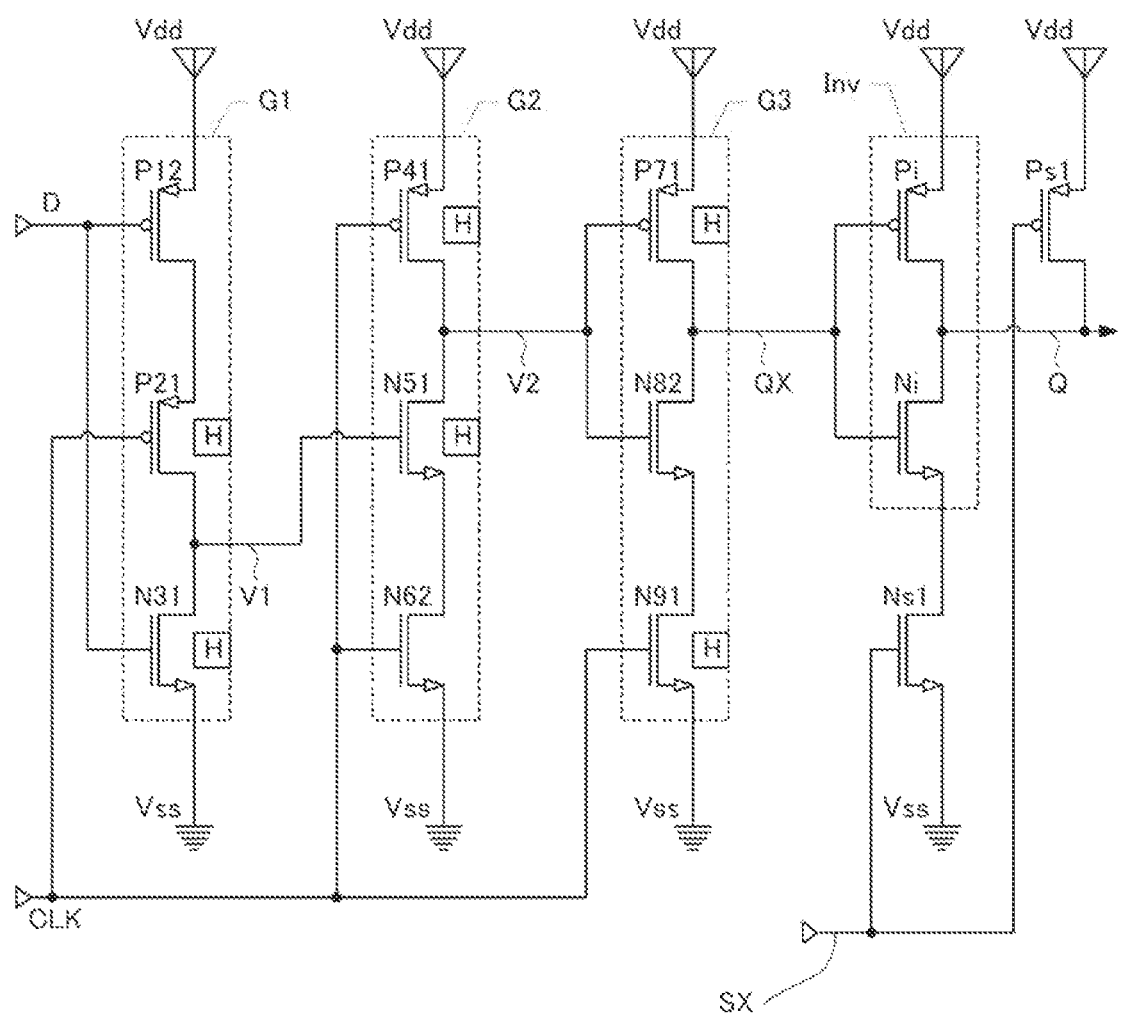
FIG. 16 is a diagram illustrating the flip-flop circuit.

Further, the flip-flop circuit may be settable. Such a configuration may be realized by adding a first set MOS transistor Ns1 and a second set MOS transistor Ps1 to the above-described configuration illustrated in FIG. 2, as illustrated in FIG. 16. The first set MOS transistor Ns1 is provided between the eleventh MOS transistor Ni and the low potential node Vss. The second set MOS transistor Ps1 is provided between the output signal node Q that outputs the output signal of the CMOS inverter circuit Inv and the high potential node Vdd. According to this configuration, when the state of a set node SX is 0 and the state of the clock signal node CLK is 0, the first set MOS transistor Ns1 is turned off and the second set MOS transistor Ps1 is turned on. As a result, the state of the output signal node Q of the CMOS inverter circuit Inv becomes 1. Thus, it is possible to provide a flip-flop circuit capable of being set by controlling the state of the set node SX. In this example, since the output signal node Q does not enter the floating state, the threshold voltages of the first set MOS transistor Ns1 and the second set MOS transistor Ps1 may or may not be high.

Further, in the flip-flop circuit, elements of which positions are replaceable may be replaced. For example, in at least one set of a set including the first and second MOS transistors P12 and P21, a set including the fifth and sixth MOS transistors N51 and N62, and a set including the eighth and ninth MOS transistors N82 and N91, the position between the high potential node Vdd and the low potential node Vss may be changed without changing the node coupled to the gate.

Figure 17:
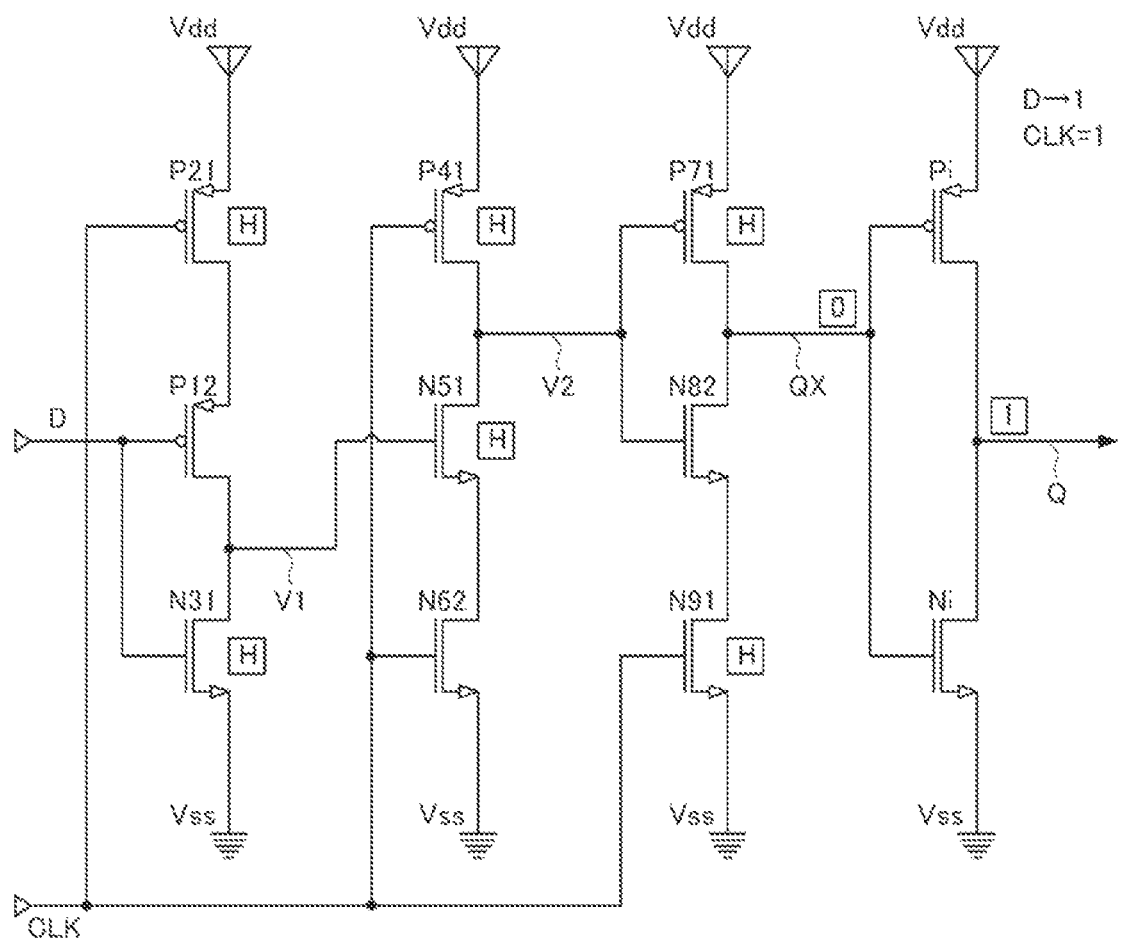
FIG. 17 is a diagram illustrating the flip-flop circuit.

Specifically, even though the first and second MOS transistors P12 and P21 in the flip-flop circuit illustrated in FIG. 13 are replaced with each other, the operation of the flip-flop circuit does not change. Thus, the set including the first and second MOS transistors P12 and P21 is replaceable. Therefore, the configuration illustrated in FIG. 13 may be changed as illustrated in FIG. 17.

Figure 18:
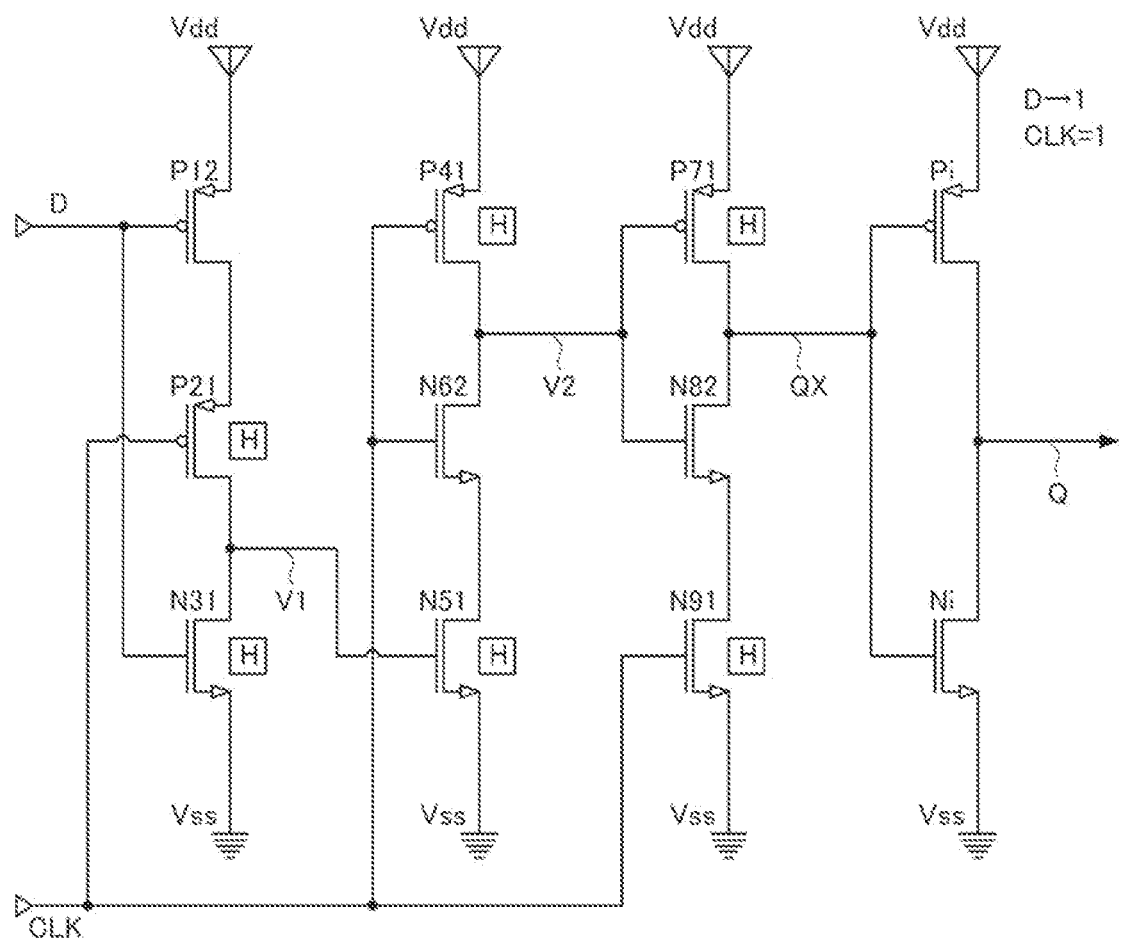
FIG. 18 is a diagram illustrating the flip-flop circuit.

The operation of the flip-flop circuit does not change even though the fifth and sixth MOS transistors N51 and N62 in the flip-flop circuit illustrated in FIG. 13 are replaced with each other. Thus, the set including the fifth and sixth MOS transistors N51 and N62 is replaceable. Therefore, the configuration illustrated in FIG. 13 may be changed as illustrated in FIG. 18.

Figure 19:
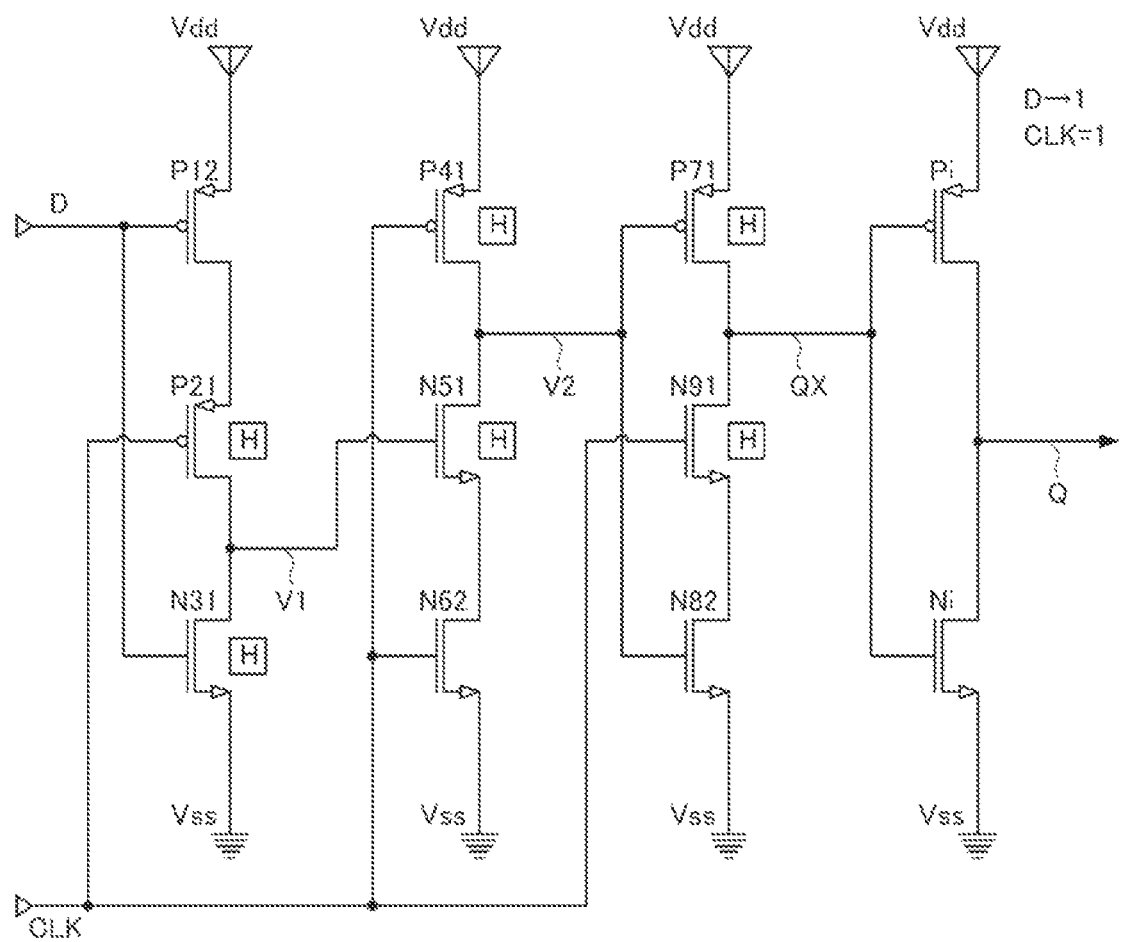
FIG. 19 is a diagram illustrating the flip-flop circuit.

The operation of the flip-flop circuit does not change even though the eighth and ninth MOS transistors N82 and N91 in the flip-flop circuit illustrated in FIG. 13 are replaced with each other. Thus, the set including the eighth and ninth MOS transistors N82 and N91 is replaceable. Therefore, the configuration illustrated in FIG. 13 may be modified as illustrated in FIG. 19.

The exchange may be performed in any of the sets including replaceable transistors. For example, in the configuration illustrated in FIG. 17, the sets including the fifth and sixth MOS transistors N51 and N62 may be replaced with each other. The set including the eighth and ninth MOS transistors N82 and N91 may be replaced with each other. All of the sets may be replaced. Further, in the configuration illustrated in FIG. 18, the sets including the eighth and ninth MOS transistors N82 and N91 may be replaced with each other. Further, in the resettable flip-flop circuit and the settable flip-flop circuit as illustrated in FIGS. 15 and 16, the MOS transistors in at least one set of the sets including the replaceable MOS transistors may be replaced.

Figure 20:
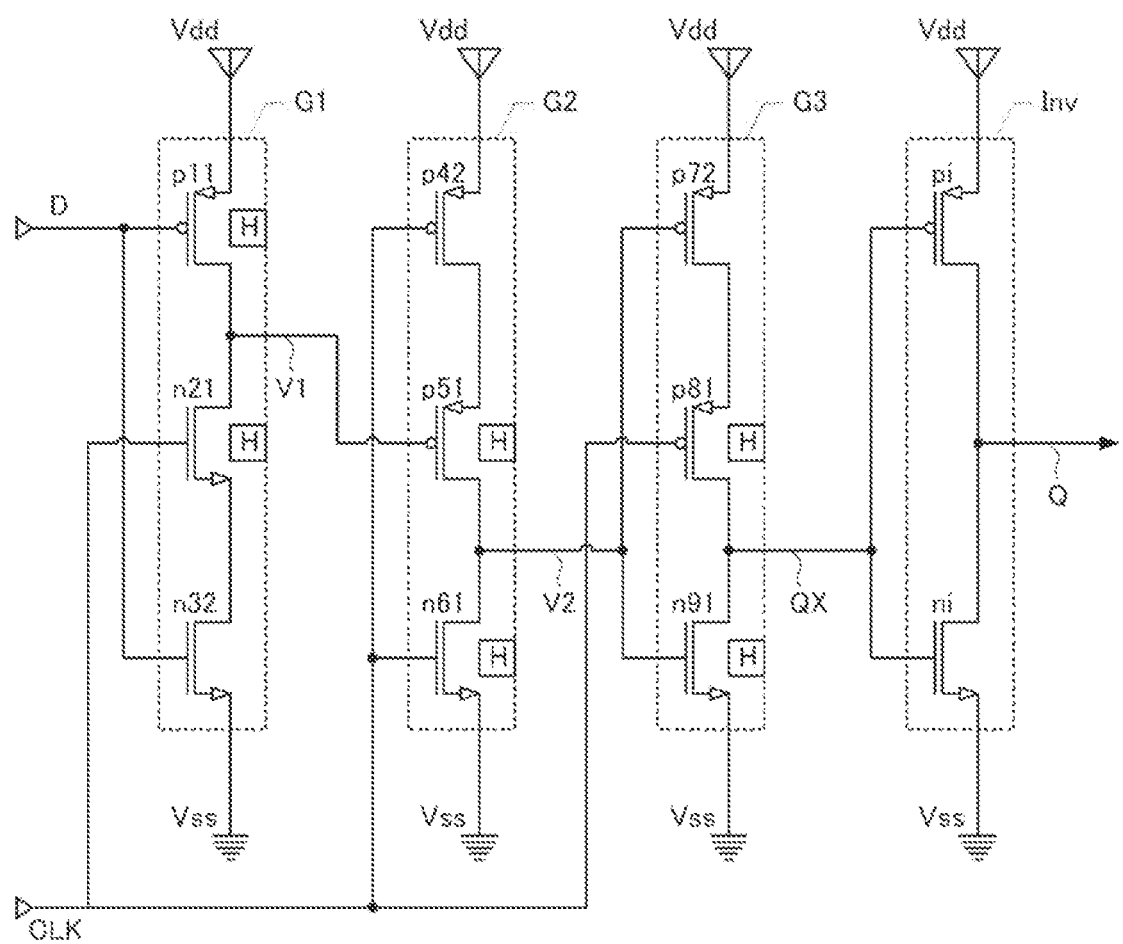
FIG. 20 is a diagram illustrating the flip-flop circuit.

As illustrated in FIG. 3, the above-described embodiment is the flip-flop circuit in which the state of the output signal node Q changes at the rising edge of the clock signal applied to the clock signal node CLK. However, the timing at which the output signal node changes may be the falling edge of the clock signal. FIG. 20 illustrates a configuration example of a flip-flop circuit that operates at the falling edge of the clock signal.

Specifically, the flip-flop circuit includes first to third gate circuits G1 to G3 and a CMOS inverter circuit Inv. The first gate circuit G1 includes first to third MOS transistors p11, n21, n32 that are coupled in series between the high potential node Vdd and the low potential node Vss, and are arranged from the high potential side to the low potential side. The second gate circuit G2 includes fourth to sixth MOS transistors p42, p51, and n61 that are coupled in series between the high potential node Vdd and the low potential node Vss, and are arranged from the high potential side to the low potential side. The third gate circuit G3 includes seventh to ninth MOS transistors p72, p81, n91 that are coupled in series between the high potential node Vdd and the low potential node Vss, and are arranged from the high potential side to the low potential side.

The CMOS inverter circuit Inv includes tenth and eleventh MOS transistors pi and ni that are coupled in series between the high potential node Vdd and the low potential node Vss, and are arranged from the high potential side to the low potential side.

The first, fourth, fifth, seventh, and eighth MOS transistors p11, p42, p51, p72, and p81 are PMOS transistors. The second, third, sixth, and ninth MOS transistors n21, n32, n61, and n91 are NMOS transistors. The clock signal node CLK is coupled to the gates of the second, fourth, sixth, and eighth MOS transistors n21, p42, n61 and p81. The clock signal is input.

An input signal node D is coupled to the gates of the first and third MOS transistors p11 and n32, and an input signal from the outside is input. An output signal node V1 of the first gate circuit G1 is coupled to the gate of the fifth MOS transistor p51, and an output signal from the first gate circuit G1 is input. The output signal node V1 is a node between the drain of the first MOS transistor p11 and the drain of the second MOS transistor n21.

An output signal node V2 is coupled to the gates of the seventh and ninth MOS transistors p72 and n91, and the output signal from the second gate circuit G2 is input. The output signal node V2 is a node between the drain of the fifth MOS transistor p51 and the drain of the sixth MOS transistor n61. An output signal node QX is coupled to the gates of the tenth and eleventh MOS transistors pi and ni, and an output signal from the third gate circuit G3 is input. An output signal node Q of the CMOS inverter circuit Inv is a node that outputs the output signal of the flip-flop circuit.

In the flip-flop circuit having the above configuration, the state of the output signal node Q changes at the rising edge of the clock signal. Also in this configuration, the output signal nodes V1, V2 and QX may be in a floating state. Therefore, the first, second, fifth, sixth, eighth, and ninth MOS transistors p11, n21, p51, n61, p81, and n91 are classified into a first MOS transistor group, and have high threshold voltage. The third, fourth, and seventh MOS transistors n32, p42, and p72 are classified into a second MOS transistor group, and have a low threshold voltage.

According to this configuration, it is possible to provide a flip-flop circuit capable of operating at a low speed, in comparison to a case where the threshold voltages of all the MOS transistors are low. Also in the present embodiment, similar to the embodiment illustrated in FIG. 2, a configuration in which the threshold voltage of at least one MOS transistor selected from the first MOS transistor group is higher than the threshold voltage of the MOS transistor classified into the second MOS transistor group may be made.

The gate circuits may be N circuits for outputting output signals in response to the clock signal and the input signal, and be coupled such that the output signal from the (N−1)th gate circuit serves as the input signal of the N-th gate circuit. The number of circuits is not limited, and at least one of output signals of the N gate circuits may be used. A circuit other than the gate circuit may be coupled to the node of each gate circuit, and the coupled circuit is not limited to the reset circuit or the set circuit, and various circuits may be coupled.

The number of MOS transistors forming one gate circuit is not limited to three, and may be any number. The output signal of the gate circuit may change in accordance with the clock signal and the input signal. That is, the polarity of the MOS transistor is selected such that the output signal is determined based on one or both of the clock signal and the input signal. The output signal from the (N−1)th gate circuit serves as the input signal of the Nth gate circuit, but the output signal from the N-th gate circuit may be used for any purpose. That is, the output signal may be an input signal of the next gate circuit, or may be used in a circuit other than the gate circuit.

Each gate circuit includes the first MOS transistor group and the second MOS transistor group. That is, the first MOS transistor group is MOS transistors that are in the OFF state when the potential of the output signal node that outputs the output signal is held. The first MOS transistor group includes the MOS transistor that is turned off between the output signal node and the low potential node when the high potential is held, when the potential to be held by the output signal node is high. The first MOS transistor group includes the MOS transistor that is turned off between the output signal node and the high potential node when the low potential is held, when the potential to be held by the output signal node is low.

That is, the MOS transistor that is in the OFF state when the potential of a certain node is held to be at least one of the high potential and the low potential is classified into the first MOS transistor group. The second MOS transistor group is MOS transistors that are in the ON state when the potential of the output signal node is held. That is, the MOS transistor that does not contribute to the holding of the potential because the MOS transistor is in the ON state when holding the potential is included in the second MOS transistor group. In order to clearly switch ON and OFF of the MOS transistor by the voltage applied to the gate, that is, the input signal and the clock signal, the MOS transistor is preferably an enhancement type.

The threshold voltage is the minimum value of the voltage required to turn on the MOS transistor, that is, to make the MOS transistor conductive. As described above, the threshold voltage is a parameter for controlling ON and OFF of the MOS transistor, and the magnitude of the leakage current depends on the threshold voltage. That is, as the threshold voltage increases, the leakage current is reduced. Thus, the change of the threshold voltage in the MOS transistor is equivalent to the change of the parameter correlated with the threshold voltage. For example, when the threshold voltage increases or decreases by an increase or decrease of the ion implantation amount, a high threshold voltage is equivalent to a large ion implantation amount.

The threshold voltage of at least one MOS transistor in the first MOS transistor group may be higher than the threshold voltage of at least one MOS transistor in the second MOS transistor group. That is, the threshold voltage may be increased to reduce the magnitude of the leakage current in comparison to other MOS transistors, and thereby one or more MOS transistors that need to hold the potential for a longer period may selected from the first MOS transistor group and the threshold voltage may be set to be high.

The threshold voltage of at least one MOS transistor in the first MOS transistor group may be higher than at least one of the MOS transistors in the second MOS transistor group. The threshold voltage may be generally selected from a plurality of discrete values. Therefore, two threshold voltages having different magnitudes are selected from the selectable threshold voltage values, and the MOS transistor having the higher threshold voltage is provided as at least one MOS transistor of the first MOS transistor group. The MOS transistor having the lower threshold voltage is provided as at least one MOS transistor of the second MOS transistor group. When the threshold voltage may be intended to be changed more flexibly, the threshold voltage may be selected such that the threshold voltage increases as the amount of the leakage current to be suppressed by increasing the threshold voltage becomes higher.

What is claimed is:

1. A flip-flop circuit comprising:
   a first gate circuit including first to third MOS transistors coupled in series between a high potential node and a low potential node;
   a second gate circuit including fourth to sixth MOS transistors coupled in series between the high potential node and the low potential node; and
   a third gate circuit including seventh to ninth MOS transistors coupled in series between the high potential node and the low potential node, wherein
   the first to third MOS transistors are arranged in an order of the first, second, and third transistors or in an order of the second, first, and third transistors, from a high potential side to a low potential side,
   the fourth to sixth MOS transistors are arranged in the order of the fourth, fifth, and sixth transistors or in an order of the fourth, sixth, and fifth transistors, from the high potential side to the low potential side,
   the seventh to ninth MOS transistors are arranged in the order of the seventh, eighth, and ninth transistors or in an order of the seventh, ninth, and eighth transistors, from the high potential side to the low potential side,
   the first, second, fourth, and seventh MOS transistors are PMOS transistors,
   the third, fifth, sixth, eighth, and ninth MOS transistors are NMOS transistors,
   a clock signal is input to gates of the second, fourth, sixth, and ninth MOS transistors,
   an input signal from an outside is input to gates of the first and third MOS transistors, an output signal from a node between a drain of the second MOS transistor and a drain of the third MOS transistor is input to a gate of the fifth MOS transistor, an output signal from a node between a drain of the fourth MOS transistor and a drain of the fifth MOS transistor is input to gates of the seventh and eighth MOS transistors, and threshold voltages of the second and fourth MOS transistors are higher than a threshold voltage of the first MOS transistor.

2. A flip-flop circuit comprising:

a first gate circuit including first to third MOS transistors that are coupled in series between a high potential node and a low potential node and arranged from a high potential side to a low potential side;

a second gate circuit including fourth to sixth MOS transistors that are coupled in series between the high potential node and the low potential node and arranged from the high potential side to the low potential side; and a third gate circuit including seventh to ninth MOS transistors that are coupled in series between the high potential node and the low potential node and arranged from the high potential side to the low potential side, wherein the first to third MOS transistors are arranged in an order of the first, second, and third transistors or in an order of the second, first, and third transistors, from the high potential side to the low potential side, the fourth to sixth MOS transistors are arranged in the order of the fourth, fifth, and sixth transistors or in an order of the fourth, sixth, and fifth transistors, from the high potential side to the low potential side, the seventh to ninth MOS transistors are arranged in the order of the seventh, eighth, and ninth transistors or in an order of the seventh, ninth, and eighth transistors, from the high potential side to the low potential side, the first, second, fourth, and seventh MOS transistors are PMOS transistors, the third, fifth, sixth, eighth, and ninth MOS transistors are NMOS transistors, a clock signal is input to gates of the second, fourth, sixth, and ninth MOS transistors, an input signal from an outside is input to gates of the first and third MOS transistors, an output signal from a node between a drain of the second MOS transistor and a drain of the third MOS transistor is input to a gate of the fifth MOS transistor, an output signal from a node between a drain of the fourth MOS transistor and a drain of the fifth MOS transistor is input to gates of the seventh and eighth MOS transistors, and threshold voltages of the third and ninth MOS transistors are higher than threshold voltages of the sixth and eighth MOS transistors.

3. A flip-flop circuit comprising:

a first gate circuit including first to third MOS transistors that are coupled in series between a high potential node and a low potential node and arranged from a high potential side to a low potential side;

a second gate circuit including fourth to sixth MOS transistors that are coupled in series between the high potential node and the low potential node and arranged from the high potential side to the low potential side; and a third gate circuit including seventh to ninth MOS transistors that are coupled in series between the high potential node and the low potential node and arranged from the high potential side to the low potential side, wherein the first to third MOS transistors are arranged in an order of the first, second, and third transistors or in an order of the second, first, and third transistors, from the high potential side to the low potential side, the fourth to sixth MOS transistors are arranged in the order of the fourth, fifth, and sixth transistors or in an order of the fourth, sixth, and fifth transistors, from the high potential side to the low potential side, the seventh to ninth MOS transistors are arranged in the order of the seventh, eighth, and ninth transistors or in an order of the seventh, ninth, and eighth transistors, from the high potential side to the low potential side, the first, second, fourth, and seventh MOS transistors are PMOS transistors, the third, fifth, sixth, eighth, and ninth MOS transistors are NMOS transistors, a clock signal is input to gates of the second, fourth, sixth, and ninth MOS transistors, an input signal from an outside is input to gates of the first and third MOS transistors, an output signal from a node between a drain of the second MOS transistor and a drain of the third MOS transistor is input to a gate of the fifth MOS transistor, an output signal from a node between a drain of the fourth MOS transistor and a drain of the fifth MOS transistor is input to gates of the seventh and eighth MOS transistors, and a threshold voltage of the fifth MOS transistor is higher than threshold voltages of the sixth and eighth MOS transistors, and a threshold voltage of the seventh MOS transistor is higher than a threshold voltage of the first MOS transistor.

4. The flip-flop circuit according to claim 1, wherein a threshold voltage of the seventh MOS transistor is higher than the threshold voltage of the first MOS transistor, and threshold voltages of the third, fifth, and ninth MOS transistors are higher than the threshold voltages of the sixth and eighth MOS transistors.

5. The flip-flop circuit according to claim 1, further comprising:

a reset MOS transistor provided between the high potential node and an output signal node in the third gate circuit, wherein the reset MOS transistor is a PMOS transistor, and a threshold voltage of the reset MOS transistor is higher than the threshold voltage of the first MOS transistor.

6. The flip-flop circuit according to claim 1, further comprising:

a CMOS inverter circuit including a tenth MOS transistor being a PMOS transistor and an eleventh MOS transistor being an NMOS transistor, an output signal from the third gate circuit being input to the CMOS inverter circuit;

a first set MOS transistor provided between the eleventh MOS transistor and the low potential node; and a second set MOS transistor provided between the high potential node and an output signal node from which an output signal of the CMOS inverter circuit is output.

7. A flip-flop circuit comprising:

a first gate circuit including first to third MOS transistors that are coupled in series between a high potential node and a low potential node and arranged from a high potential side to a low potential side;

a second gate circuit including fourth to sixth MOS transistors that are coupled in series between the high potential node and the low potential node and arranged from the high potential side to the low potential side; and a third gate circuit including seventh to ninth MOS transistors that are coupled in series between the high potential node and the low potential node and arranged from the high potential side to the low potential side, wherein the first, fourth, fifth, seventh, and eighth MOS transistors are PMOS transistors, the second, third, sixth, and ninth MOS transistors are NMOS transistors, a clock signal is input to gates of the second, fourth, sixth, and eighth MOS transistors, an input signal from an outside is input to gates of the first and third MOS transistors, an output signal from a node between a drain of the first MOS transistor and a drain of the second MOS transistor is input to a gate of the fifth MOS transistor, an output signal from a node between a drain of the fifth MOS transistor and a drain of the sixth MOS transistor is input to gates of the seventh and ninth MOS transistors, threshold voltages of the first, fifth, and eighth MOS transistors are higher than threshold voltages of the fourth and seventh MOS transistors, and threshold voltages of the second, sixth, and ninth MOS transistors are higher than a threshold voltage of the third MOS transistor.

8. The flip-flop circuit according to claim 2, wherein threshold voltages of the second, fourth, and seventh MOS transistors are higher than the threshold voltage of the first MOS transistor, and a threshold voltage of the fifth MOS transistor is higher than the threshold voltages of the sixth and eighth MOS transistors.

9. The flip-flop circuit according to claim 3, wherein threshold voltages of the second and fourth MOS transistors are higher than the threshold voltage of the first MOS transistor, and threshold voltages of the third and ninth MOS transistors are higher than the threshold voltages of the sixth and eighth MOS transistors.

10. The flip-flop circuit according to claim 2, further comprising:

a reset MOS transistor provided between the high potential node and an output signal node in the third gate circuit, wherein the reset MOS transistor is a PMOS transistor, and a threshold voltage of the reset MOS transistor is higher than the threshold voltage of the first MOS transistor.

11. The flip-flop circuit according to claim 3, further comprising:

a reset MOS transistor provided between the high potential node and an output signal node in the third gate circuit, wherein the reset MOS transistor is a PMOS transistor, and a threshold voltage of the reset MOS transistor is higher than the threshold voltage of the first MOS transistor.

12. The flip-flop circuit according to claim 2, further comprising:

a CMOS inverter circuit including a tenth MOS transistor being a PMOS transistor and an eleventh MOS transistor being an NMOS transistor, an output signal from the third gate circuit being input to the CMOS inverter circuit;

a first set MOS transistor provided between the eleventh MOS transistor and the low potential node; and a second set MOS transistor provided between the high potential node and an output signal node from which an output signal of the CMOS inverter circuit is output.

13. The flip-flop circuit according to claim 3, further comprising:

a CMOS inverter circuit including a tenth MOS transistor being a PMOS transistor and an eleventh MOS transistor being an NMOS transistor, an output signal from the third gate circuit being input to the CMOS inverter circuit;

a first set MOS transistor provided between the eleventh MOS transistor and the low potential node; and a second set MOS transistor provided between the high potential node and an output signal node from which an output signal of the CMOS inverter circuit is output.

* * * * *